United States Patent
Lim et al.

(10) Patent No.: US 9,224,753 B2
(45) Date of Patent: Dec. 29, 2015

(54) SEMICONDUCTOR MEMORY DEVICE AND METHOD OF FABRICATING THE SAME

(71) Applicants: Tai-Soo Lim, Seoul (KR); Jeonggil Lee, Hwaseong-si (KR); Yeon-Sil Sohn, Yongin-si (KR); Woonghee Sohn, Seoul (KR); Myoungbum Lee, Seoul (KR); Yong Chae Jung, Suwon-si (KR)

(72) Inventors: Tai-Soo Lim, Seoul (KR); Jeonggil Lee, Hwaseong-si (KR); Yeon-Sil Sohn, Yongin-si (KR); Woonghee Sohn, Seoul (KR); Myoungbum Lee, Seoul (KR); Yong Chae Jung, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/599,933

(22) Filed: Jan. 19, 2015

(65) Prior Publication Data
US 2015/0243675 A1 Aug. 27, 2015

(30) Foreign Application Priority Data
Feb. 24, 2014 (KR) ........................ 10-2014-0021406

(51) Int. Cl.
*H01L 29/792* (2006.01)
*H01L 27/115* (2006.01)
*H01L 29/49* (2006.01)

(52) U.S. Cl.
CPC .... *H01L 27/11582* (2013.01); *H01L 27/11568* (2013.01); *H01L 29/4975* (2013.01)

(58) Field of Classification Search
CPC ................... H01L 21/28282; H01L 21/28273; H01L 27/11551
USPC ................... 257/324, 208, 302; 438/591, 268
See application file for complete search history.

(56) References Cited

U.S. PATENT DOCUMENTS

| | | | |
|---|---|---|---|
| 8,193,571 B2 | 6/2012 | Katsumata et al. | |
| 8,198,670 B2* | 6/2012 | Aoyama | 257/324 |
| 8,283,719 B2 | 10/2012 | Huo et al. | |
| 8,324,677 B2 | 12/2012 | Lee et al. | |
| 8,569,826 B2 | 10/2013 | Kidoh et al. | |
| 2010/0038699 A1 | 2/2010 | Katsumata et al. | |
| 2010/0207185 A1 | 8/2010 | Lee et al. | |
| 2010/0270593 A1* | 10/2010 | Lung et al. | 257/208 |
| 2011/0101443 A1 | 5/2011 | Huo et al. | |
| 2011/0309431 A1 | 12/2011 | Kidoh et al. | |
| 2012/0098048 A1 | 4/2012 | Choe et al. | |

(Continued)

FOREIGN PATENT DOCUMENTS

JP 2012146773 A 8/2012
KR 20120097634 A 9/2012

*Primary Examiner* — Theresa T Doan
(74) *Attorney, Agent, or Firm* — Harness, Dickey & Pierce, P.L.C.

(57) ABSTRACT

Provided are a semiconductor memory device and a fabricating method thereof. The device includes a stack including vertical channel structures that penetrate insulating patterns and gate electrodes that are alternately and repeatedly stacked on each other. Each of the gate electrodes includes first and second gate conductive layers. In a first region between an outer side of the stack and the vertical channel structures, the first gate conductive layer is adjacent to the vertical channel structures and includes a truncated end portion, the second gate conductive layer has a portion adjacent to the vertical channel structures and covered by a corresponding one of the first gate conductive layer and an opposite portion that is not covered with the first gate conductive layer. In a second region between the vertical channel structures, the first gate conductive layer may be extended to continuously cover surfaces of the second gate conductive layer.

19 Claims, 28 Drawing Sheets

(56) References Cited

U.S. PATENT DOCUMENTS

| | | |
|---|---|---|
| 2012/0146122 A1 | 6/2012 | Whang et al. |
| 2013/0016875 A1 | 1/2013 | Boulila |
| 2013/0049097 A1 | 2/2013 | Ahn |
| 2013/0168752 A1 | 7/2013 | Kim et al. |
| 2013/0228841 A1 | 9/2013 | Kuboi et al. |

\* cited by examiner

SEMICONDUCTOR MEMORY DEVICE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2014-0021406, filed on Feb. 24, 2014, in the Korean Intellectual Property Office, the entire contents of which are hereby incorporated by reference.

BACKGROUND

Example embodiments of inventive concepts relate to a semiconductor memory device and a method of fabricating the same, and in particular, to a vertical-type semiconductor memory device and a method of fabricating the same.

Higher integration of semiconductor memory devices is desired to satisfy consumer demands for superior performance and inexpensive prices. In the case of semiconductor memory devices, since their integration may affect product prices, increased integration is desired. In the case of typical two-dimensional or planar semiconductor memory devices, their integration may be determined by the area occupied by a unit memory cell. Thus, integration density is strongly dependent on a level of fine pattern forming technology. However, process equipment for increasing pattern fineness may be very expensive and therefore can set a practical limitation on increasing integration for two-dimensional or planar semiconductor memory devices. Accordingly, there are increasing demands for a semiconductor memory device with vertically-arranged memory cells.

SUMMARY

Example embodiments of inventive concepts relate to a vertical-type semiconductor memory device with increased integration density and improved electric characteristics.

Example embodiments of inventive concepts also relate to a method of fabricating a vertical-type semiconductor memory device with increased integration density and improved electric characteristics.

According to example embodiments of inventive concepts, a method of fabricating a semiconductor memory device may include forming a molding structure on a substrate, forming vertical channel structures that penetrate the molding structure, forming molding structure patterns by forming a trench in the molding structure, forming opening regions in the molding structure patterns, and forming a plurality of gate electrodes by sequentially forming first and second gate conductive layers in each of the opening regions. The molding structure may include insulating layers and sacrificial layers that are alternately and repeatedly stacked on each other. The vertical channel structures may be spaced apart from each other and arranged in columns. The columns of the vertical channel structures may be spaced apart from each other in a first direction. The molding structure patterns may be spaced apart from each other by in the first direction by the trench. Each of the molding structure patterns may include at least two of the columns of vertical channel structures. The forming the opening regions in the molding structure patterns may include exposing parts of the vertical channel structures that extend between the insulating layers. Each of the opening regions may be defined by upper and lower surfaces of the insulating layers adjacent to each other that extend from the exposed parts of the vertical channel structures. Each of the opening regions may include a first opening region between the trench and one of the at least two of the vertical channel structures that is adjacent to the trench in each of the molding structure patterns. Each of the opening regions may include a second opening region between the exposed parts of the two of the vertical channel structures in each of the molding structure patterns. The first gate conductive layers in the first opening region may be adjacent to the exposed parts of the vertical channel structures. The first gate conductive layer may include a truncated end portion in the first opening region. The second gate conductive layer may have a portion in the first opening region that is adjacent to the vertical channel structures and is covered by the first gate conductive layer. The second gate conductive layer in the first opening region may have an opposite portion that is not covered by the first gate conductive layer. The first gate conductive layer in the second opening region, may cover an inner wall of the second opening region. The first gate conductive layer in the second opening region continuously may cover top, bottom, and side surfaces of the second gate conductive layer in the second opening region.

In example embodiments, the forming the molding structure patterns may include patterning the insulating layers and the sacrificial layers to form insulating patterns and sacrificial patterns constituting the molding structure patterns, and the forming the opening region may include removing the sacrificial patterns from the molding structure patterns.

In example embodiments, the trench may be formed to extend along a second direction that is parallel to the main surface of the substrate and crosses the first direction.

In example embodiments, the second gate conductive layer may include one of a metal silicide layer and a metal layer.

In example embodiments, the second gate conductive layer may include a nickel silicide layer.

In example embodiments, the second gate conductive layer may further include a silicon layer in the second opening region.

In example embodiments, the forming the first gate conductive layer may include forming a barrier layer on inner walls of the first and second opening regions, forming a silicon layer on the barrier layer, and selectively recessing a portion of the barrier layer, which is positioned adjacent to the trench and covers the silicon layer, to form the first gate conductive layer with the truncated end portion in the first opening region.

In example embodiments, the barrier layer may include a metal nitride layer and may have a thickness ranging from 30 Å to 150 Å.

In example embodiments, the truncated end portion of the first gate conductive layer may define a groove between the silicon layer and the insulating patterns. The forming of the second gate conductive layer may include forming a metal layer in the groove and on a side surface of the silicon layer, and forming a metal silicide layer by thermally treating the metal layer.

In example embodiments, the forming the vertical channel structures may include forming channel holes in the molding structure, and sequentially forming a first blocking insulating layer, a charge storing layer, a tunnel insulating layer, and a semiconductor material on an inner wall of each of the channel holes.

In example embodiments, the method may further include forming a second blocking insulating layer. The second blocking layer may shaped like a liner and the second blocking layer may be in contact with the insulating patterns and the vertical channel structures in the first and second opening regions.

According to example embodiments of inventive concepts, a semiconductor memory device may include stack on a substrate. The stack may include insulating patterns and gate electrodes that are alternately and repeatedly stacked on each other. Vertical channel structures may penetrate the insulating patterns and the gate electrodes. Each of the gate electrodes may include first and second gate conductive layers. Each of the gate electrodes may include a first region between an outer side of the stack and the vertical channel structures and a second region between the vertical channel structures. The first gate conductive layer in the first region may be adjacent to the vertical channel structures and include a truncated end portion. The second gate conductive layer in the first region may have a portion that is adjacent to the vertical channel structures and is covered by the first gate conductive layer. The second gate conductive layer in the first region may have an opposite portion that is adjacent to the outer side of the stack and is not covered by the first gate conductive layer. The first gate conductive layer in the second region may extend to continuously cover top, bottom, and side surfaces of the second gate conductive layer in the second region.

In example embodiments, an air gap may be defined between the second gate conductive layer in the first region and the insulating patterns.

In example embodiments, the first gate conductive layer may include a metal nitride layer and a thickness of metal nitride layer ranging from 30 Å to 150 Å.

In example embodiments, each of the vertical channel structures may include a blocking insulating layer, a charge storing layer, a tunnel insulating layer, and a semiconductor material.

In example embodiments, the second gate conductive layer may include one of a metal silicide layer and a metal layer.

In example embodiments, each gate electrode in the second region may further comprise a third conductive layer being in contact with the second conductive layer.

According to example embodiments of inventive concepts, a semiconductor memory device may include a substrate, vertical channel patterns on the substrate, and a stack enclosing the vertical channel patterns on the substrate. The stack may include a first region between an outside of the stack and the vertical channel patterns and a second region between the vertical channel patterns, and gate electrodes stacked on top of each other. Each of the gate electrodes may include a barrier layer and a metal silicide layer. Each of the barrier layers in the first region may be adjacent to the vertical channel patterns and include a truncated end portion. Each of the metal silicide layers in the first region may have a portion that is adjacent to the vertical channel patterns and be covered by a corresponding one of the barrier layers. Each of the metal silicide layers in the first region may have an opposite portion that is adjacent to the outside side of the stack and is not covered by the corresponding one of the barrier layers. Each of the barrier layers in the second region may extend to continuously cover top, bottom, and side surfaces of a corresponding one of the metal silicide layers in the second region.

In example embodiments, the barrier layer may include a metal nitride layer, and the metal silicide layer may include a nickel silicide layer.

In example embodiments, the metal silicide layer may be thicker in the first region than in the second region.

In example embodiments, a thickness of the barrier layer may range from 30 Å to 150 Å.

In example embodiments, each gate electrode in the second region may further include a silicon layer being in contact with the metal silicide layer.

In example embodiments, each of the vertical channel structures may further include a blocking insulating layer, a charge storing layer, and a tunnel insulating According to example embodiments, a semiconductor device may include a substrate including a common source region and a plurality of stacks spaced apart from each other on the substrate. A spacing between the plurality of stacks may define a trench that exposes the common source region. A plurality of vertical channel structures may penetrate each of the stacks. Each stack may include a plurality of vertical channel structures that penetrate a plurality of gate electrodes and insulating layers alternately stacked on each other. The vertical channel structures may be separated from each other and arranged in columns. Each gate electrode may have a different cross-sectional shape in a first region compared to a second region. The first region may be between the trench and the vertical channel structures of a corresponding one of the columns that is adjacent to the trench. The second region may be between vertical channel structures. Each gate electrode may include first and second gate conductive layers. The first gate conductive layer may extend between the vertical channel structures in the second region. The first gate conductive layer in the first region may define a cavity facing the trench based on the first gate conductive layer having a width at a middle portion that is less than a width at lower and upper portions of the first gate conductive layer in the first region. The second gate conductive layer in the first region may include a first portion in the cavity and a second portion between the trench and the first gate conductive layer.

In example embodiments, the first gate conductive layer in the second region may surround top, bottom, and side surfaces of the second gate conductive layer in the second region.

In example embodiments, the first gate conductive layer may include a metal nitride layer, and the second gate conductive layer may include a metal silicide layer.

In example embodiments, a thickness of the first portion of the second gate conductive layer may be less than a thickness of the second portion of the second gate conductive layer.

In example embodiments, the semiconductor memory device may further include a data storing layer between the vertical channel structures and the gate electrodes.

In example embodiments, the width at a middle portion of the first gate conductive layer may range from 30 Å to 150 Å.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1 is a sectional view taken along line I-I' of FIG. 2.

FIGS. 10A and 14A through 20A are enlarged sectional views of portions A of FIGS. 10 and 14 through 20, respectively.

Figure 1:
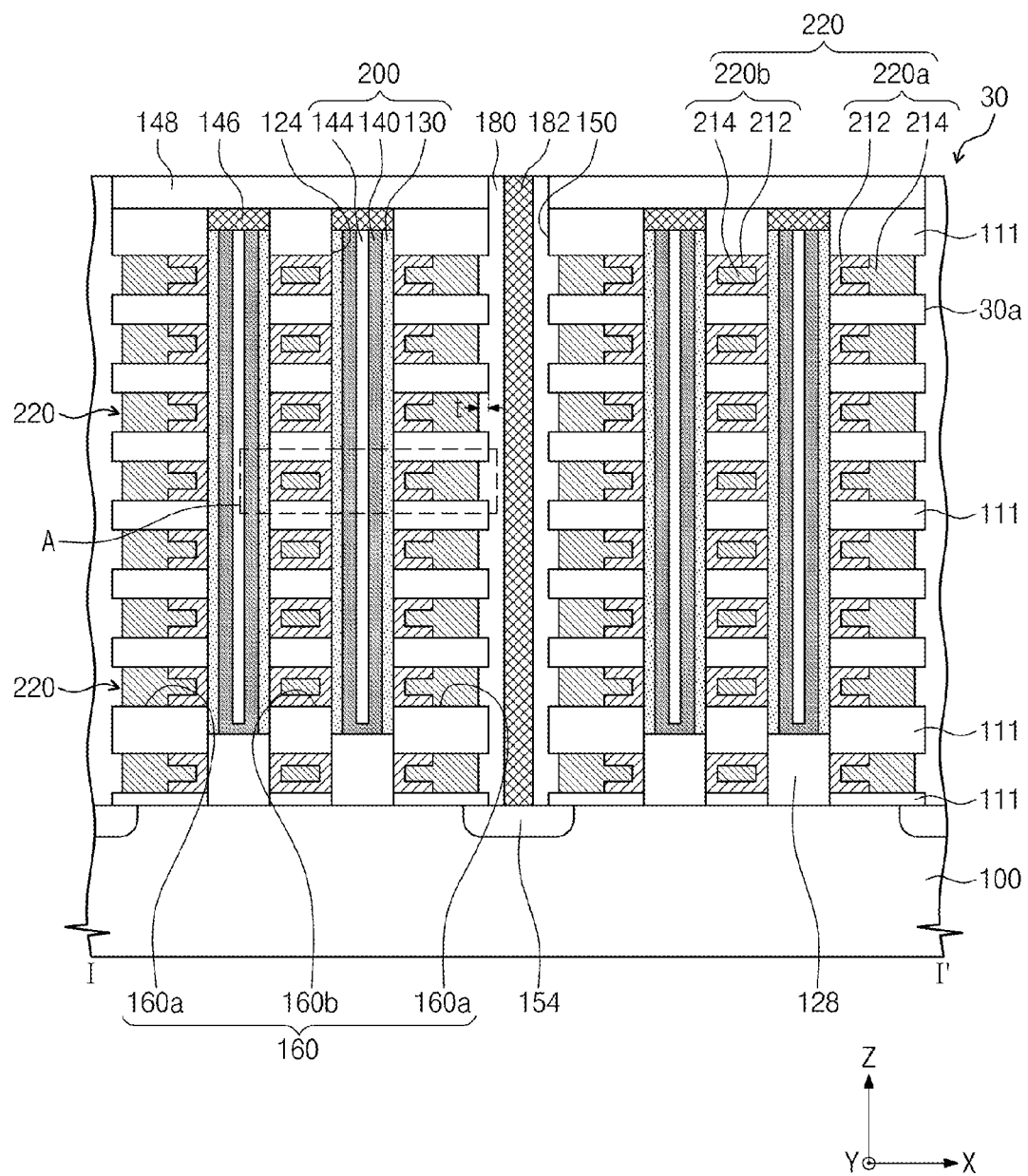
FIG. 1 is a sectional view schematically illustrating a semiconductor memory device according to example embodiments of inventive concepts.

It should be noted that these figures are intended to illustrate the general characteristics of methods, structure and/or materials utilized in some example embodiments of inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein; rather, these embodiments are provided so that this disclosure will be thorough and complete, and will fully convey the scope of inventive concepts to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
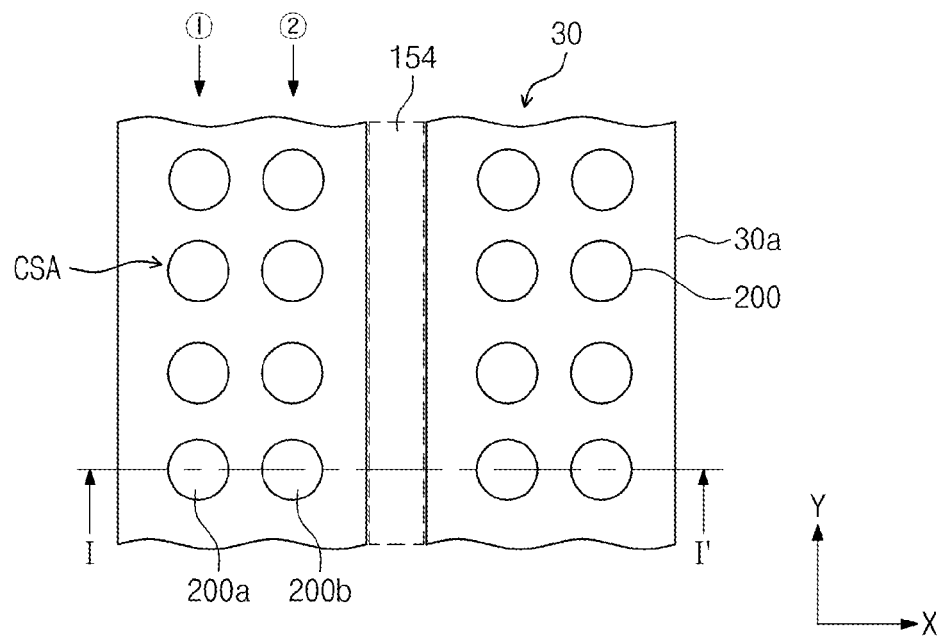
FIG. 2A is a schematic plan view illustrating a semiconductor memory device according to example embodiments of inventive concepts.
Figure 2B:
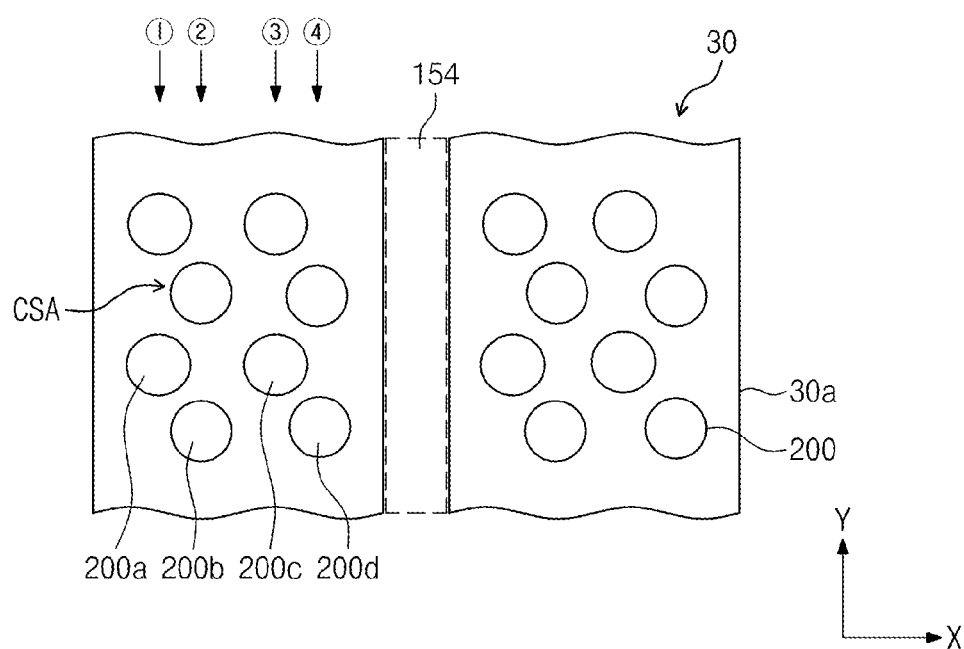
FIG. 2B is a schematic plan view illustrating a semiconductor memory device according to example embodiments of inventive concepts.
Figure 3:
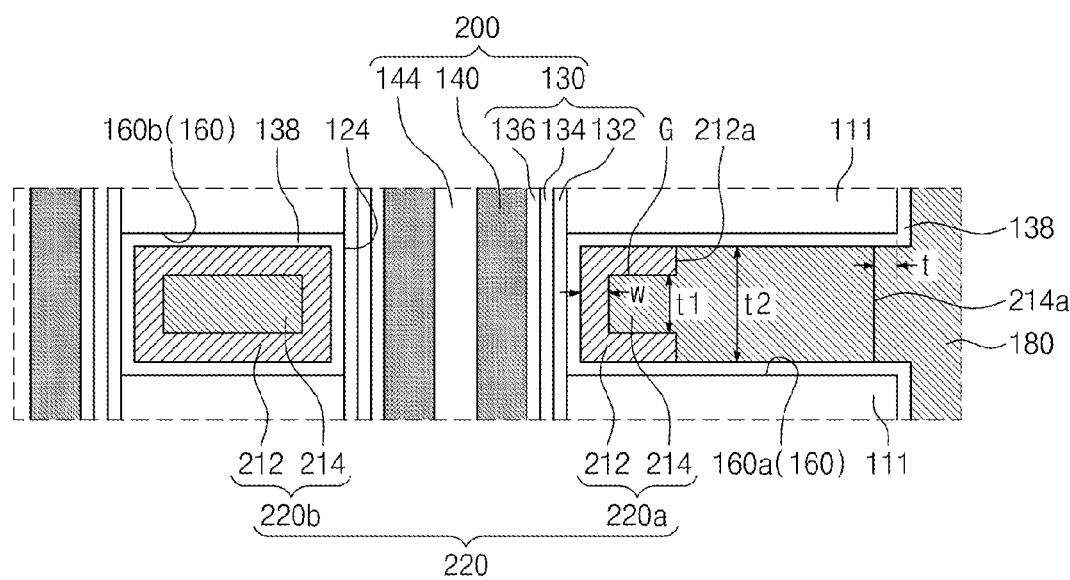
FIG. 3 is an enlarged sectional view of a portion A of FIG. 1.

FIG. 1 is a sectional view schematically illustrating a semiconductor memory device according to example embodiments of inventive concepts. FIGS. 2A and 2B are plan views illustrating semiconductor memory devices according to example embodiments of inventive concepts. Here, FIG. 1 is a sectional view taken along line I-I' of FIG. 2A. FIG. 3 is an enlarged sectional view of a portion A of FIG. 1.

Referring to FIGS. 1 through 3, according to example embodiments of inventive concepts, a semiconductor memory device may include a substrate 100, a stack 30, and vertical channel structures 200 penetrating the stack 30. The stack 30 may be disposed on the substrate. The stack 30 may include a plurality of insulating patterns 111 and a plurality of gate electrodes 220 that are alternately and repeatedly stacked on each other. The vertical channel structures 200 may be two-dimensionally arranged on a main surface (e.g., a top surface) of the substrate 100. For example, in a first direction (e.g., x direction) that is parallel to the main surface of the substrate 100, the vertical channel structures 200 may be disposed spaced apart from each other. Each of the vertical channel structures 200 may extend in a third direction (e.g., z direction) that is perpendicular to the main surface of the substrate 100. In example embodiments, the semiconductor memory device may be a vertical-type semiconductor memory device.

The substrate 100 may include a semiconductor material such as silicon and/or germanium. For example, the substrate 100 may be a single crystalline silicon wafer, a single crystalline germanium wafer, or a single crystalline silicon-germanium wafer. Alternatively, the substrate 100 may be provided in the form of a semiconductor-on-insulator (SOI) wafer. For example, the substrate 100 may include a semiconductor substrate, an insulating layer, which is disposed on the semiconductor substrate to protect transistors provided on the semiconductor substrate, and a semiconductor layer (e.g., made of silicon, silicon-germanium, or germanium) provided on the insulating layer. The substrate 100 may be doped to have a first conductivity type (e.g., of p-type).

As shown in FIG. 2A, the stack 30 may be a line-shaped structure extending along a second direction (e.g., y direction) or across the first direction. The first and second directions may be parallel to, for example, the main surface of the substrate 100. In the stack 30, some or all of the insulating patterns 111 may have a thickness that is smaller than that of each of the gate electrodes 220. However, example embodiments are not limited thereto. For example, at least one of the insulating patterns 111 may be thicker than each of the gate electrodes 220. For example, in a vertical position relative to the substrate 100, the second lowermost one and the uppermost one of the insulating patterns 111 may be thicker than each of the gate electrodes 220. Alternatively, all of the insulating patterns 111 and the gate electrodes 220 may have the same thickness. Alternatively, the lowermost one of the insulating patterns 111 in contact with the substrate 100 may be thinner than another of the insulating patterns 111 provided thereon. The insulating patterns 111 may include a dielectric material (e.g., a silicon oxide layer).

The vertical channel structures 200 may be electrically connected to the substrate 100 through the stack 30. Referring to FIG. 2A, the vertical channel structures 200 may be arranged to form a vertical channel structure array CSA. In the vertical channel structure array CSA, the vertical channel structures 200 may be arranged to constitute two columns parallel to the second direction. For example, the vertical channel structures 200 may include first vertical channel structures 200a constituting a first column ① and second vertical channel structures 200b constituting a second column ②, and the first column ① of the vertical channel structures 200 may be disposed spaced apart from the second column ② of the second vertical channel structures 200b in the first direction. As shown in FIG. 2A, the vertical channel structures 200 may be arranged along the first and second directions to form a matrix-shaped arrangement. The first vertical channel structures 200a may be provided to have translational symmetry with the second vertical channel structures 200b in the first direction. In example embodiments, the semiconductor memory device may include a plurality of the vertical channel structure arrays CSA that are repeatedly disposed along the first direction with common source regions 154 interposed therebetween.

Referring to FIG. 2B, in the vertical channel structure array CSA, the vertical channel structures 200 may be arranged to constitute at least two columns parallel to the second direction. For example, the vertical channel structures 200 may include the first vertical channel structures 200a constituting the first column ① and the second vertical channel structures 200b constituting the second column ②, and the first column ① of the vertical channel structures 200 may be disposed spaced apart from the second column ② of the second vertical channel structures 200b in the first direction. The vertical channel structures 200 may be provided to have a zigzag arrangement. For example, the first vertical channel structures 200a may be provided in such a way that they do not have translational symmetry in the first direction with respect to the second vertical channel structures 200b. The first vertical channel structures 200a may be provided at positions that are shifted, by half pitch of the vertical channel structures 200 in the second direction, from those the second vertical channel structures 200b.

In addition, the vertical channel structure array CSA may include third and fourth vertical channel structures 200c and 200d, which are arranged to constitute third and fourth columns ③ and ④ positioned adjacent to each other in the first direction, in addition to the first and second vertical channel structures 200a and 200b constituting the first and second columns ① and ②. The first and third vertical channel structures 200a and 200c may be provided in such a way that they have translational symmetry in the first direction. The second and fourth vertical channel structures 200b and 200d may also be provided in such a way that they have translational symmetry in the first direction. In example embodiments, the semiconductor memory device may include a plurality of the vertical channel structure arrays CSA that are repeatedly disposed along the first direction with common source regions 154 interposed therebetween.

Although an example in which the vertical channel structures 200 constitute two or four columns is illustrated in FIG. 2A and FIG. 2B, example embodiments of inventive concepts are not limited to a specific number of the columns of the vertical channel structures 200.

The vertical channel structures 200 may be provided to penetrate a plurality of the gate electrodes 220. Each of the gate electrodes 220 may enclose sidewalls of the vertical channel structures 200. Each of the vertical channel structures 200 may further include a semiconductor pattern 128 provided on the substrate 100. The semiconductor pattern 128 may be in contact with the substrate 100 and may be shaped like a pillar extending upward from the substrate 100. The semiconductor pattern 128 may include a doped or undoped semiconductor material. For example, the semiconductor pattern 128 may be or include an epitaxial layer containing single crystalline silicon.

Each of the vertical channel structures 200 may include a data storing pattern 130, a vertical channel pattern 140, and an insulating gap-filling pattern 144. The vertical channel pattern 140 may be disposed between the data storing pattern 130 and the insulating gap-filling pattern 144. In example embodiments, the vertical channel pattern 140 may be shaped like a hollow cylinder with an open top or a macaroni. In example embodiments, the vertical channel pattern 140 may be shaped like a pipe with open top and bottom ends. In example embodiments, the vertical channel pattern 140 may be shaped like a solid circular cylinder, and in this case, the insulating gap-filling pattern 144 may not be provided in the vertical channel structure 200. The vertical channel pattern 140 may include a semiconductor material with polycrystalline or amorphous crystal structure. For example, the vertical channel pattern 140 may be formed of or include silicon (Si), germanium (Ge), or a mixture thereof. In example embodiments, the vertical channel pattern 140 may include a semiconductor material that is not doped with impurities or is doped with impurities that the same conductivity type as that of the substrate 100.

The data storing pattern 130 may be disposed between the stack 30 and the vertical channel pattern 140. The data storing pattern 130 may be shaped like a pipe with open top and bottom ends. The data storing pattern 130 may be configured in such a way that data stored therein can be changed using a Fowler-Nordheim tunneling effect, which occurs when there is a large voltage difference between the vertical channel structure 200 and the gate electrodes 220. Alternatively, the data storing pattern 130 may include a thin-film structure configured in such a way that data stored therein can be changed by one of ways that are different from the Fowler-Nordheim tunneling effect. For example, the data storing pattern 130 may include a memory element or a layered structure exhibiting a phase-changeable or variable resistance property.

As illustrated in FIG. 3 of the present application, the data storing pattern 130 may include a first blocking insulating layer 132 adjacent to the gate electrodes 220, a tunnel insulating layer 136 adjacent to the vertical channel pattern 140, and a charge storing layer 134 therebetween. The tunnel insulating layer 136 may be, for example, a silicon oxide layer. The charge storing layer 134 may be a trap insulating layer or an insulating layer with conductive nano dots. The trap insulating layer may include, for example, a silicon nitride layer. The first blocking insulating layer 132 may include at least one of a silicon oxide layer and/or high-k dielectrics (e.g., aluminum oxide or hafnium oxide). The first blocking insulating layer 132 may be provided in a single-layered structure or a multi-layered structure including a plurality of thin-films. As an example, the first blocking insulating layer 132 may be a single-layered structure with a silicon oxide layer. As another example, the first blocking insulating layer 132 may be a multi-layered structure including at least one of an aluminum oxide layer and/or a hafnium oxide layer.

A second blocking insulating layer 138 may be additionally provided. For example, the second blocking insulating layer 138 may be interposed between the insulating patterns 111 and the gate electrodes 220 to cover top and bottom surfaces and/or at least a portion of side surfaces of the gate electrodes 220. In example embodiments, the second blocking insulating layer 138 may consist of a single layer or a plurality of layers. For example, the second blocking insulating layer 138 may include at least one of high-k dielectrics (e.g., aluminum oxide or hafnium oxide). Alternatively, the second blocking insulating layer 138 may be omitted.

The insulating gap-filling pattern 144 may be formed to fill a gap region of the vertical channel structure 200. The insulating gap-filling pattern 144 may include at least one of a silicon oxide layer or a silicon nitride layer.

Conductive pads 146 may be provided on the vertical channel structures 200, respectively. In example embodiments, each of the conductive pads 146 may include a conductive material. Alternatively, the conductive pads 146 may be impurity regions doped with impurities. End portions of the vertical channel structures 200 in contact with the conductive pads 146 may serve as drain regions. Each of the conductive pads 146 may be connected to a corresponding one of bit lines (not shown) provided thereon.

In a vertical-type semiconductor memory device (e.g., a vertical-type NAND FLASH memory device) according to example embodiments, the gate electrodes 220 may be used as control gate electrodes of memory cells. For example, some of the gate electrodes 220 may serve as word lines of the vertical-type semiconductor memory device. As an example, the gate electrodes 220, except for the uppermost and lowermost gate electrodes, may serve as the word lines for controlling electric potentials of the vertical channel structures 200. Here, the gate electrodes 220 and the vertical channel structures 200 may constitute a plurality of memory cell strings, each of which includes a plurality of the memory cells arranged on the substrate 100 along the third direction.

The uppermost and lowermost ones of the gate electrodes 220 may be used as gate electrodes of selection transistors SST and GST. For example, the uppermost one of the gate electrodes 220 may be used as a gate electrode of the string selection transistor SST controlling electric connection between the bit line (not shown) and each of the vertical channel structures 200, and the lowermost one of the gate electrodes 220 may be used as a gate electrode of the ground selection transistor GST controlling electric connection between each of the vertical channel structures 200 and the common source region 154.

Each of the gate electrodes 220 may be sectioned into a first region 220a and a second region 220b, according to their positions relative to the vertical channel structures 200. For example, in each of the gate electrodes 220, the first region 220a may be positioned between a sidewall 30a of the stack 30 and the vertical channel structures 200 or outside the vertical channel structures 200, and the second region 220b may be positioned between the vertical channel structures 200. Further, the stack 30 may include opening regions 160 defined by the insulating patterns 111. Each of the opening regions 160 may include a first opening region 160a adjacent to the sidewall 30a of the stack 30 and a second opening region 160b between the vertical channel structures 200. In each of the gate electrodes 220, the first region 220a may be located in the first opening region 160a, and the second region 220b may be located in the second opening region 160b.

Each of the gate electrodes 220 may include a first gate conductive layer 212 and a second gate conductive layer 214. The first gate conductive layer 212 may be disposed between the second blocking insulating layer 138 and the second gate conductive layer 214. The first conductive layer 212 may be disposed between the second gate conductive layer 214 and the data storing pattern 130. The first gate conductive layer 212 may serve as a barrier layer. For example, the first gate conductive layer 212 may include a metal nitride layer. As an example, the first gate conductive layer 212 may include titanium nitride (TiN) or tantalum nitride (TaN). The second gate conductive layer 214 may include a metal silicide layer. For example, the second gate conductive layer 214 may include at least one of a nickel silicide layer, a cobalt silicide layer, a titanium silicide layer, a tungsten silicide layer, or a tantalum silicide layer. In example embodiments, the second gate conductive layer 214 may be a single-layered structure having a conductive metal layer. For example, the second gate conductive layer 214 may be any one of a tungsten layer, a nickel layer, a cobalt layer, a titanium layer, or a tantalum layer. The first gate conductive layer 212 may have a thickness ranging from about 30 Å to about 150 Å. For example, a thickness W of the first gate conductive layer 212 may range from about 30 Å to about 150 Å, when measured on sidewalls of the vertical channel structures 200 or in the first direction. In the case where the first gate conductive layer 212 is formed to such a thickness, it is possible to limit and/or prevent leakage current from being formed between the second gate conductive layer 214 and the vertical channel structures 200, and thus, the first gate conductive layer 212 can have an improved barrier property. For example, if the second gate conductive layer 214 includes a nickel silicide layer, the first gate conductive layer 212 may contribute to limit and/or prevent nickel from being diffused into the vertical channel structure 200 during an erase operation of the memory cells. As a result, leakage current may be limited and/or prevented from occurring between the gate electrodes 220 and the vertical channel structures 200, and thus, the vertical-type semiconductor memory device can be operated with improved reliability.

Referring to FIGS. 1 and 3, the first gate conductive layer 212 of each of the gate electrodes 220 may have a truncated end portion 212a and a ring-shaped portion, which are provided in the first and second regions 220a and 220b, respectively, and are continuously connected to each other. For example, the first gate conductive layer 212 may have a cross section shaped like a letter "C" or a sideways letter "U" in the first region 220a and have a cross section shaped like a ring in the second region 220b. The second gate conductive layer 214 may have a truncated end portion 214a in the first region 220a and extend into the second region 220b. In other words, the first gate conductive layer 212 in the first region 220a may have a cross section shape that defines a cavity G facing the insulating separation layer 180 in the trench 150. The cavity G may be defined because a width (or the thickness) W of a middle portion of the first gate conductive layer 212 is less than a width of each of upper and lower portions of the first gate conductive layer 212 in the first region 220a. The second gate conductive layer 214 in the first region 220a may have a first portion having a first thickness t1 and a second portion having a thickness t2 that is thicker than the first thickness t1. The first portion of the second gate conductive layer 214 in the first region 220a may extend into the cavity G defined by the first gate conductive layer 212. The second portion with the second thickness t2 of the second gate conductive layer 214 may be between the insulation separation layer 180 and the first gate conductive layer 212 in the first region 220a.

In the first region 220a of each of the gate electrodes 220, the first gate conductive layer 212 may be provided adjacent to the vertical channel structures 200, and the second gate conductive layer 214 may include a portion, which is positioned adjacent to the vertical channel structures 200 and is covered with the first gate conductive layer 212, and an opposite portion, which is positioned adjacent to the sidewall 30a of the stack 30 and is not covered with the first gate conductive layer 212. For example, the opposite portion of the second gate conductive layer 214 may be in contact with the second blocking insulating layer 138 or the insulating patterns 111 and extend toward the sidewall 30a of the stack 30 to be in contact with the insulating separation layer 180. Accordingly, the opposite portion of the second gate conductive layer 214 may be thicker than the portion adjacent to the vertical channel structures 200, and this makes it possible to reduce electric resistance of the gate electrodes 220. Since the gate electrodes 220 can have a reduced resistance without an increase in thickness of the gate electrodes 220, it is possible to improve not only an integration density of the vertical-type semiconductor memory device but also electric characteristics thereof. An outer side surface of the truncated end portion 214a of the second gate conductive layer 214 may be recessed from the sidewall 30a toward the vertical channel structures 200 by a depth t. As a result, it is possible to achieve physical separation between the gate electrodes 220 adjacent to each other in the third direction and thereby to limit and/or prevent electric short circuit from being formed therebetween.

In the second region 220b of each of the gate electrodes 220, the first gate conductive layer 212 may be provided to cover top, bottom, and side surfaces of the second gate conductive layer 214. For example, the first gate conductive layer 212 may be formed to conformally cover inner surfaces of the second opening region 160b and thereby to have a ring-shaped cross section. The second gate conductive layer 214 may be thicker in the first region 220a than in the second region 220b.

As shown in FIGS. 2A and 2B, each of the gate electrodes 220 may be a conductive pattern extending along the second direction.

The common source region 154 may be formed in the substrate 100 between the stacks 30. For example, a trench 150 may be formed between the stacks 30 and parallel to the second direction, and the common source region 154 may be formed in a portion of the substrate 100 exposed by the trench 150. The trench 150 may be defined by a spacing between the stacks 30 and may expose the common source region 154. The common source region 154 may be or include an impurity region, which is doped to have, for example, a second conductivity type (e.g., n-type) that is different from that of the substrate 100. In example embodiments, the common source region 154 may further include a silicide layer provided on or in the impurity region. A source via plug 182 may be provided on the common source region 154. The source via plug 182 may be connected to the common source region 154, and thus, electric resistance of the common source region 154 can be effectively reduced. The source via plug 182 may include a plurality of island-shaped patterns arranged along the second direction or may be a line-shaped pattern extending parallel to the second direction. The source via plug 182 may include a conductive material. For example, the conductive material for the source via plug 182 may include at least one of metallic materials (e.g., tungsten).

An insulating separation layer 180 may be disposed between the sidewall 30a of the stacks 30 and the source via plug 182. In example embodiments, the insulating separation layer 180 may be provided in the form of a spacer to expose the common source region 154 and be in contact with the gate electrodes 220. In example embodiments, the insulating separation layer 180 may be provided to fill a gap region between the insulating patterns 111 and thereby to protect side surfaces of the gate electrodes 220.

Figure 4:
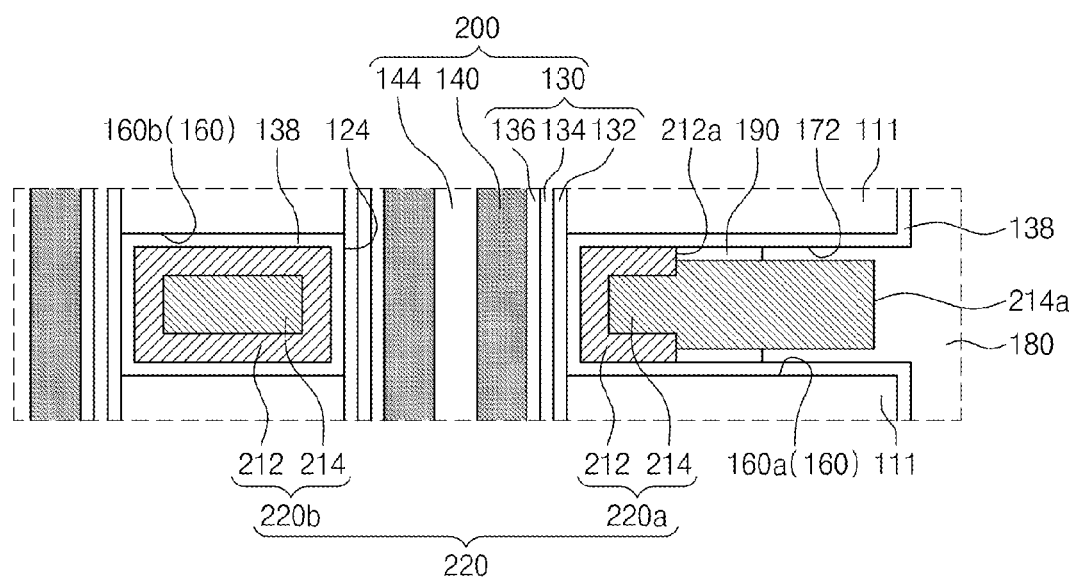
FIG. 4 is an enlarged sectional view illustrating a portion (e.g., the portion A of FIG. 1) of a semiconductor memory device, according to example embodiments of inventive concepts.
Figure 5:
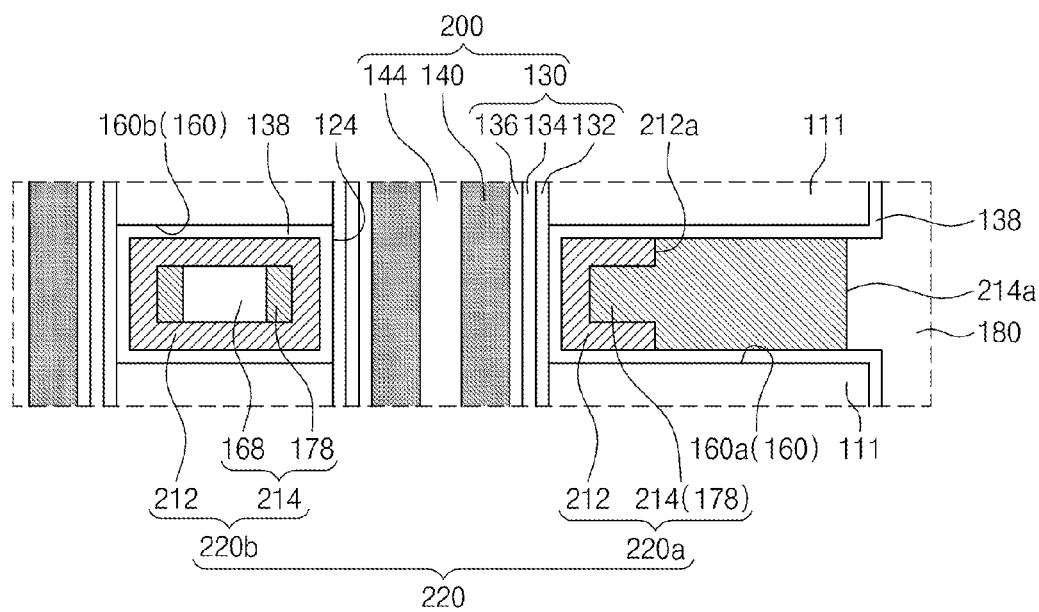
FIG. 5 is an enlarged sectional view illustrating a portion (e.g., the portion A of FIG. 1) of a semiconductor memory device, according to example embodiments of inventive concepts.
Figure 6:
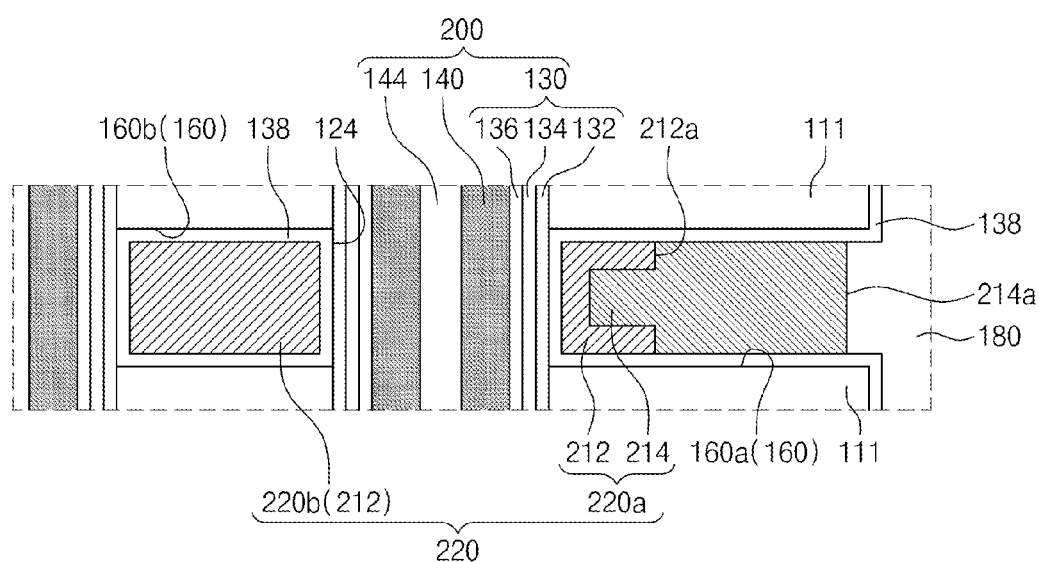
FIG. 6 is an enlarged sectional view illustrating a portion (e.g., the portion A of FIG. 1) of a semiconductor memory device, according to example embodiments of inventive concepts.

FIGS. 4 through 6 are enlarged cross sectional views illustrating portions (e.g., the portion A of FIG. 1) of semiconductor memory devices, according to example embodiments of inventive concepts.

Referring to FIG. 4, an air gap 190 may be formed between the second gate conductive layer 214 and the insulating patterns 111 or near the first region 220a of the gate electrodes 220. For example, in the case where the second gate conductive layer 214 including a metal silicide layer is thin, a groove 172 may be formed between the second blocking insulating layer 138 and the second gate conductive layer 214. If the groove 172 is incompletely filled with the insulating separation layer 180, the air gap 190 may be formed between the second gate conductive layer 214 and the insulating patterns 111.

Referring to FIG. 5, the first region 220a of the gate electrode 220 may include a metal silicide layer 178, and the second region 220b of the gate electrode 220 may include the metal silicide layer 178 and a silicon layer 168 being contact with the silicide layer 178. For example, if, during a silicidation process of forming the metal silicide layer 178, a metal material is insufficiently provided in the second region 220b, the second region 220b may include the silicon layer 168 that is not consumed in the silicidation process. In example embodiments, the second region 220b may be configured to include the silicon layer 168 but not the metal silicide layer 178. For example, the second gate conductive layer 214 of the second region 220b may include only the silicon layer 168.

Referring to FIG. 6, the first region 220a of the gate electrode 220 may include the first and second gate conductive layers 212 and 214, and the second region 220b may include only the first gate conductive layer 212. For example, the substantially whole region of the second opening region 160b may be filled with the first gate conductive layer 212 but without the second gate conductive layer 214.

Figure 20:
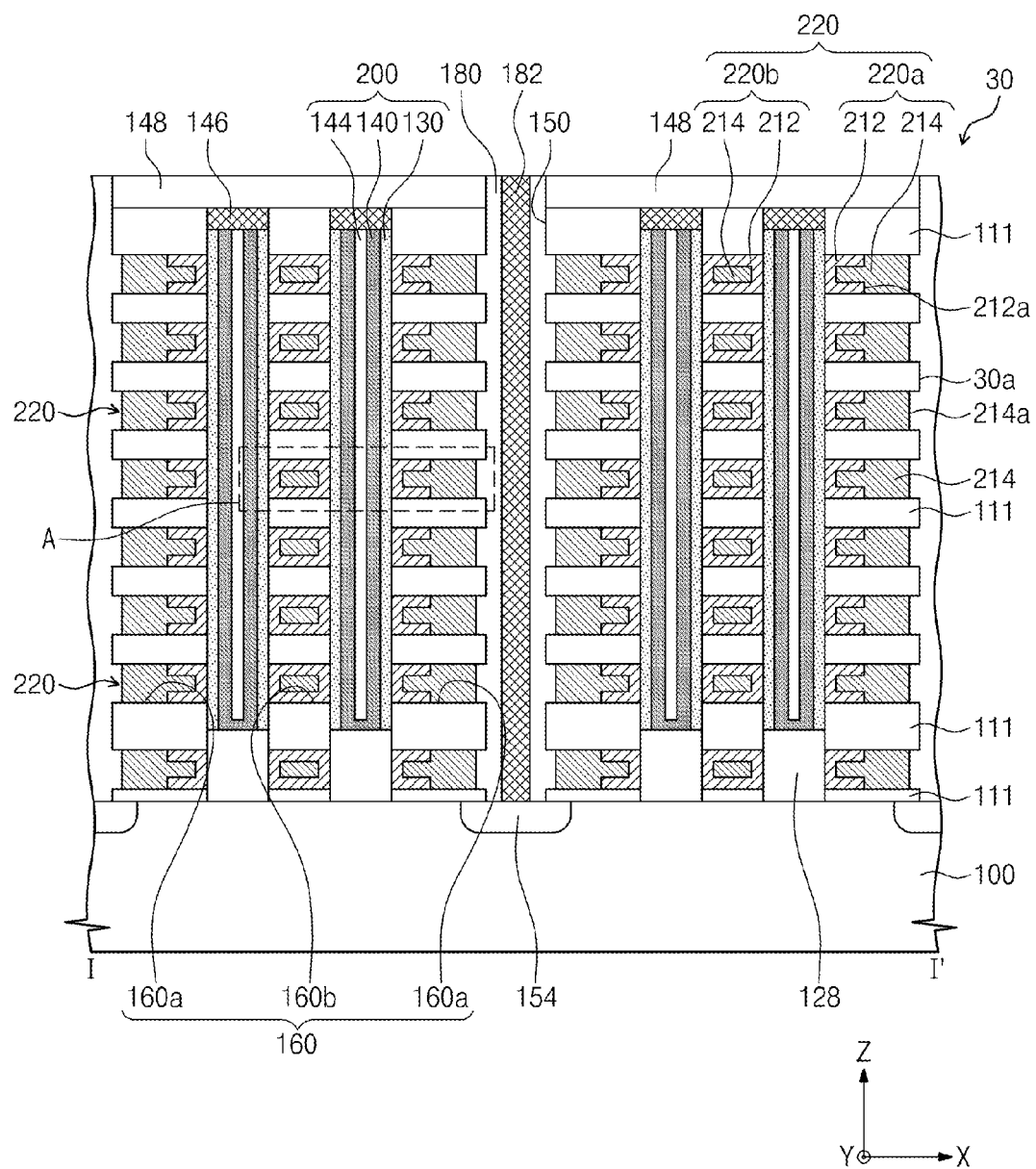
Figure 20A:
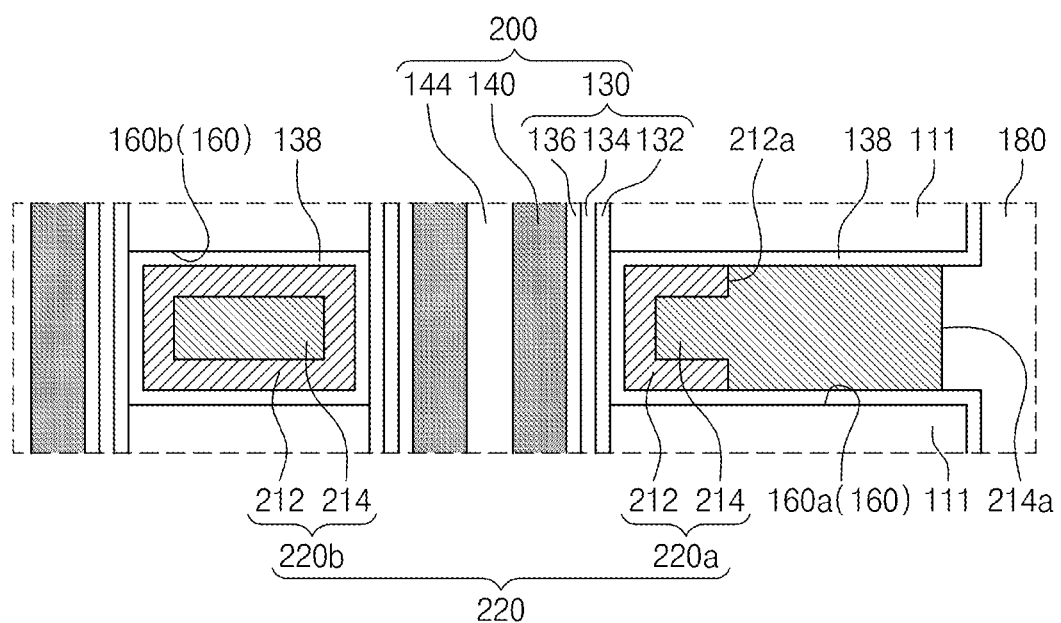
Figure 21:
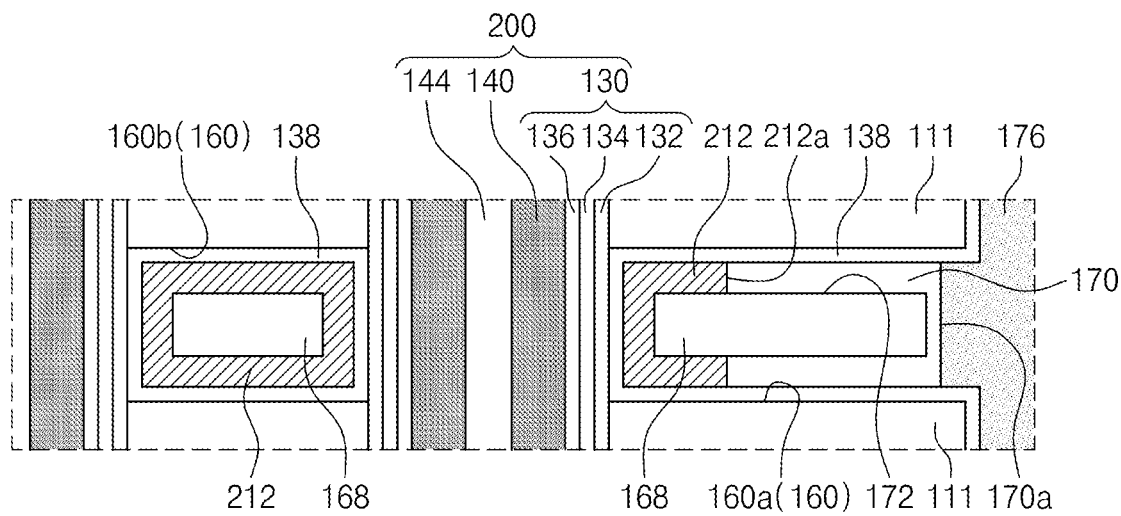
FIG. 21 is an enlarged sectional view that is provided to describe a method of fabricating a semiconductor memory device according to example embodiments of inventive concepts and illustrates a vertical channel structure and a gate electrode of the semiconductor memory device.

FIGS. 7 through 20 are cross sectional views taken along I-I' of FIG. 2 to illustrate some steps of a process of fabricating a semiconductor memory device. FIGS. 10A and 14A through 20A are enlarged cross sectional views of portions A of FIGS. 10 and 14 through 20, respectively. FIG. 21 is an enlarged cross sectional view that is provided to describe a method of fabricating a semiconductor memory device according to example embodiments of inventive concepts.

Figure 7:
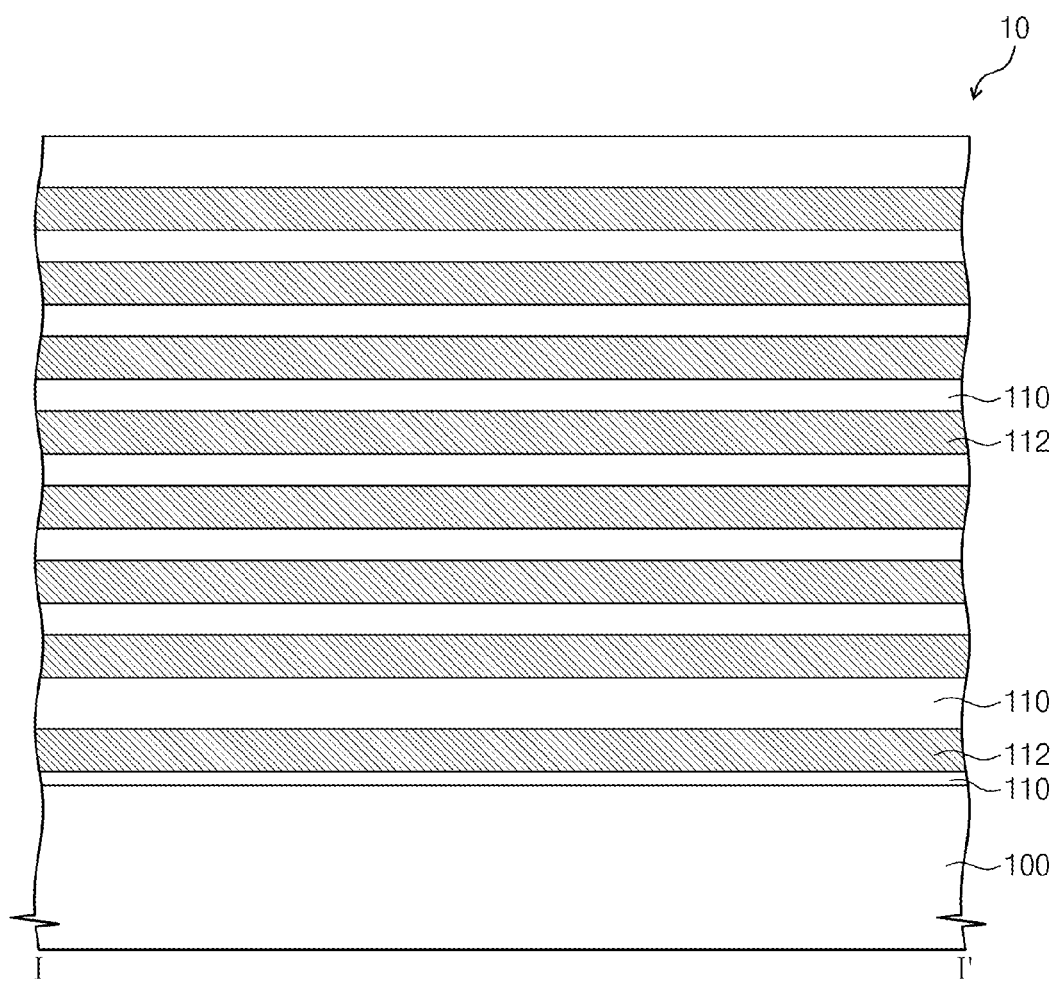
FIGS. 7 through 20 are sectional views taken along I-I' of FIG. 2 to illustrate some steps of a process of fabricating a semiconductor memory device.
Figure 7:
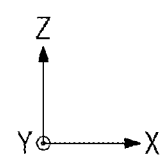

Referring to FIGS. 2A and 7, a molding structure 10 may be formed on the substrate 100. For example, the molding structure 10 may be formed by alternately and repeatedly stacking insulating layers 110 and sacrificial layers 112 on each other on.

The substrate 100 may include a semiconductor material. For example, the substrate 100 may be a single crystalline silicon wafer, a single crystalline germanium wafer, or a single crystalline silicon-germanium wafer. Alternatively, the substrate 100 may be provided in the form of a semiconductor-on-insulator (SOI) wafer. For example, the substrate 100 may include a semiconductor substrate, an insulating layer, which is disposed on the semiconductor substrate to protect transistors provided on the semiconductor substrate, and a semiconductor layer (e.g., made of silicon, silicon-germanium, or germanium) provided on the insulating layer. The substrate 100 may include an impurity layer doped to have the first conductivity type (e.g., p-type).

The sacrificial layers 112 may be formed of a material having an etch selectivity with respect to the insulating layers 110. For example, the sacrificial layers 112 may be formed of a material, which can be etched in a higher etch rate than that of the insulating layers 110 when the molding structure 10 is exposed to a specific chemical solution. As an example, the insulating layers 110 may be a silicon oxide layer or a silicon nitride layer, and the sacrificial layers 112 may be selected from the group consisting of a silicon oxide layer, a silicon nitride layer, a silicon carbide layer, a silicon layer, and a silicon germanium layer in such a way that it can have an etch selectivity with respect to the insulating layers 110. In example embodiments, the insulating layers 110 may be the silicon oxide layer, and the sacrificial layers 112 may be the silicon nitride layer.

The insulating layers 110 and the sacrificial layers 112 may be deposited using at least one of thermal chemical vapor deposition (Thermal CVD), plasma enhanced chemical vapor deposition (PE-CVD), or atomic layer deposition (ALD) techniques.

The sacrificial layers 112 may be formed to have the same thickness. In example embodiments, the lowermost and uppermost ones of the insulating layers 110 may be formed thicker than the sacrificial layers 112 interposed therebetween. Alternatively, the lowermost one of the insulating layers 110 in contact with the substrate 100 may be a silicon oxide layer, which is formed by a thermal oxidation process or a deposition process and is thinner than the remaining ones of the insulating layers 110 thereon. Further, the second lowermost one of the insulating layers 110 and the uppermost one of the insulating layers 110 may be formed thicker than the sacrificial layers 112 interposed therebetween.

Figure 8:
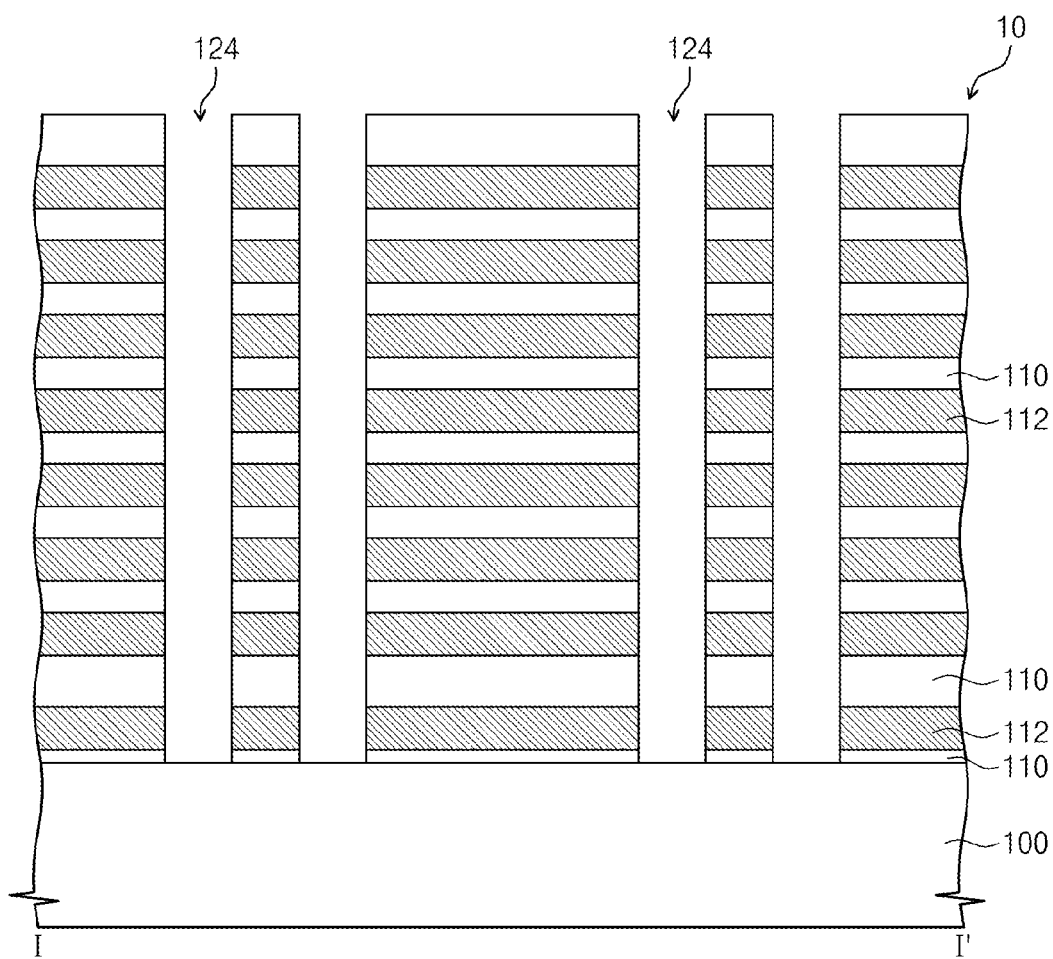

Referring to FIGS. 2 and 8, channel holes 124 may be formed to penetrate the molding structure 10 and expose the substrate 100.

The channel holes 124 may be two-dimensionally formed on the substrate 100, similar to the arrangement of the vertical channel structure array CSA described with reference to FIG. 2A. In example embodiment, the channel holes 124 may be arranged along the first and second directions to form a matrix-shaped arrangement. Alternatively, as shown in FIG. 2B, the channel holes 124 may be formed to have a zigzag arrangement.

The formation of the channel holes 124 may include forming a mask pattern (not shown) on the molding structure 10 and anisotropically etching the molding structure 10 using the mask pattern as an etch mask. During the formation of the channel holes 124, the substrate 100 may be over-etched to have a partially recessed top surface.

Figure 9:
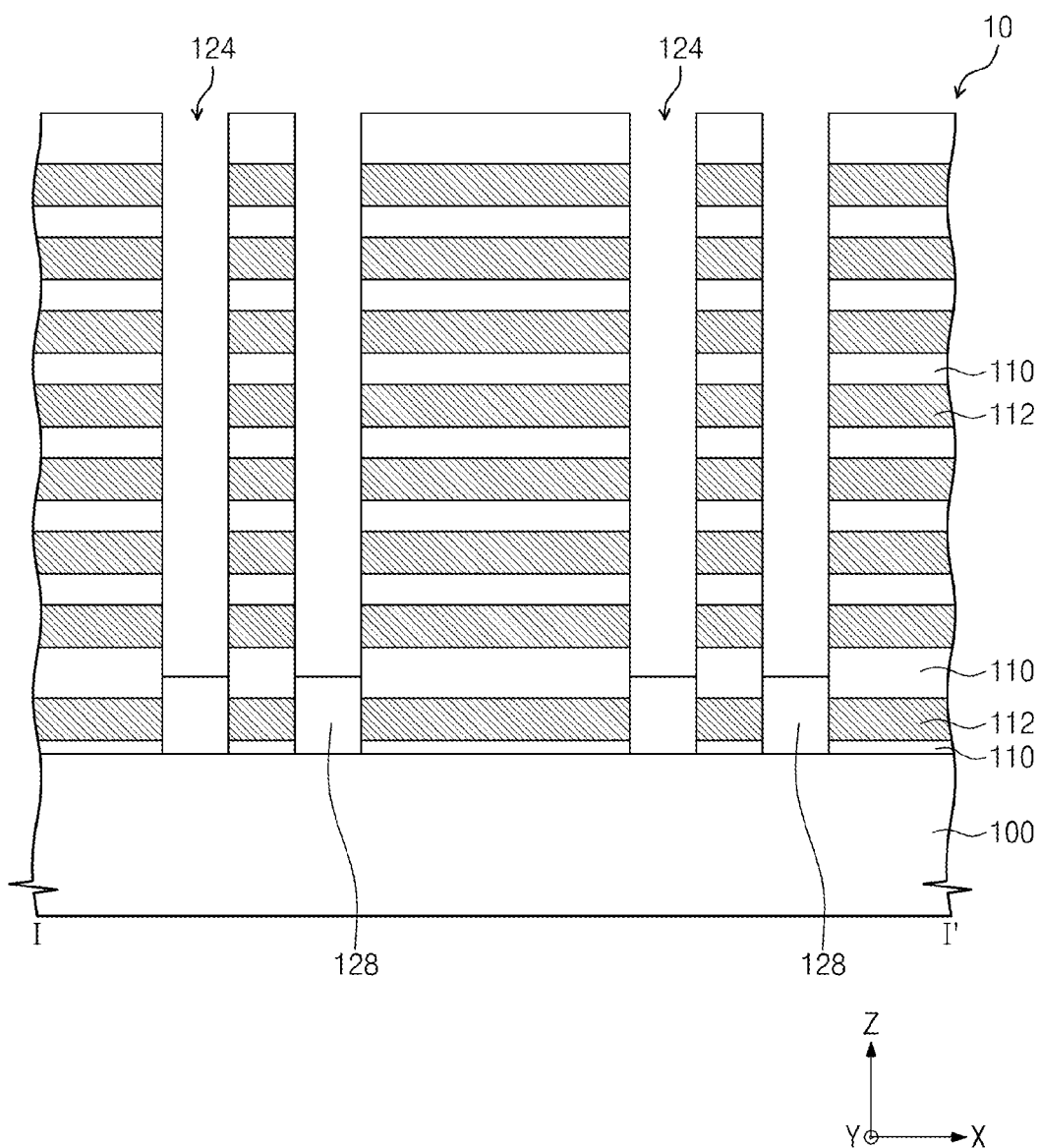

Referring to FIGS. 2A and 9, the semiconductor pattern 128 may be formed to fill a lower portion of each of the channel holes 124. The semiconductor pattern 128 may be in direct contact with sidewalls of the insulating layers 110 and the sacrificial layers 112 constituting a lower portion the molding structure 10. The semiconductor pattern 128 may be shaped like a pillar protruding upward from the substrate 100 and covering the side surface of the lowermost one of the sacrificial layers 112. The top surface of the semiconductor pattern 128 may be lower than that of the second lowermost one of the insulating layers 110, in terms of vertical position from the substrate 100. The semiconductor pattern 128 may be formed by a selective epitaxial growth (SEG) process. The semiconductor pattern 128 may be doped with impurities that have the same conductivity type as the substrate 100. For example, the semiconductor pattern 128 may be doped in an in-situ manner during the selective epitaxial growth process. Alternatively, the doping of the semiconductor pattern 128 may be achieved by an additional ion implantation process.

Figure 10:
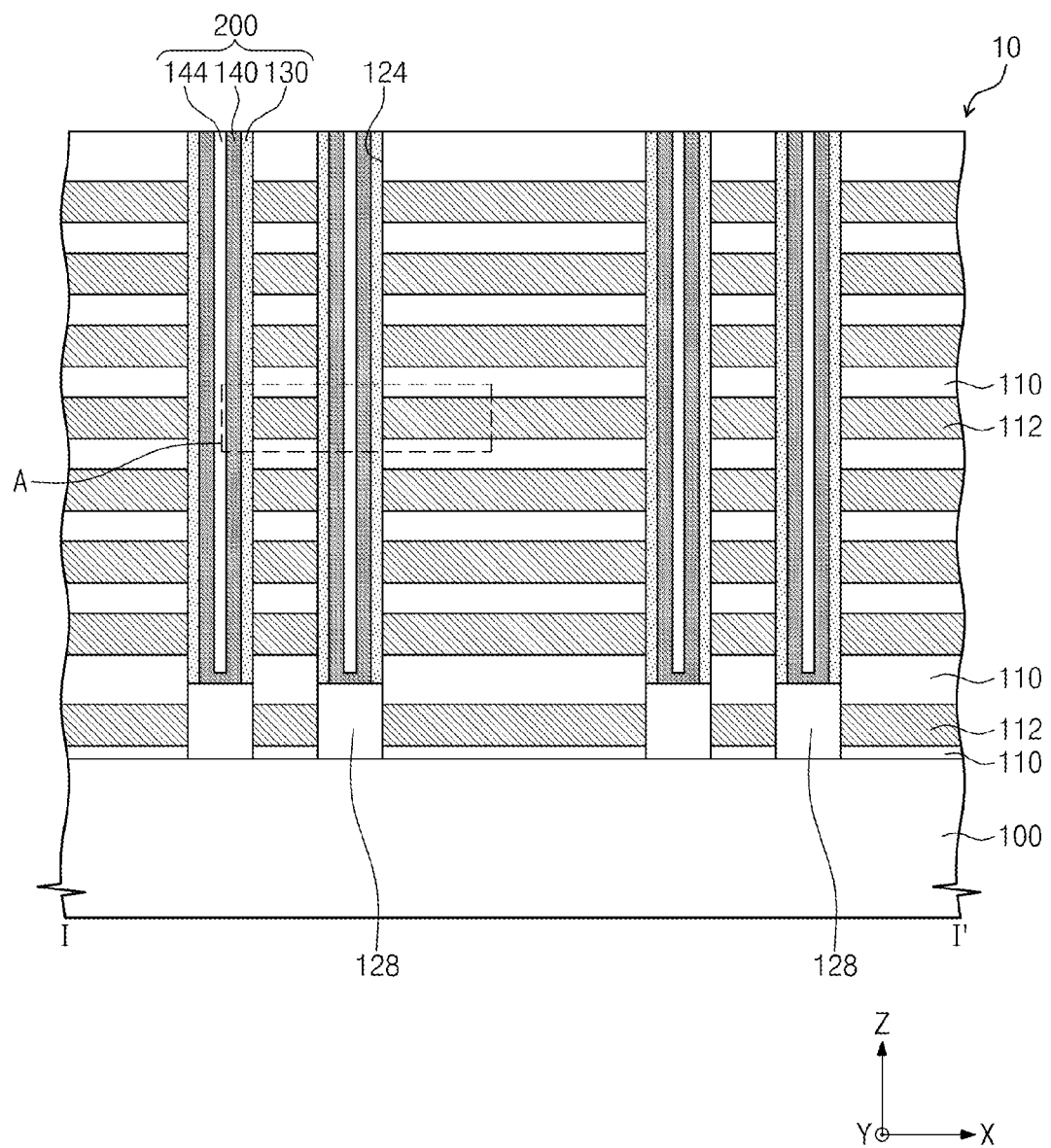
Figure 10A:
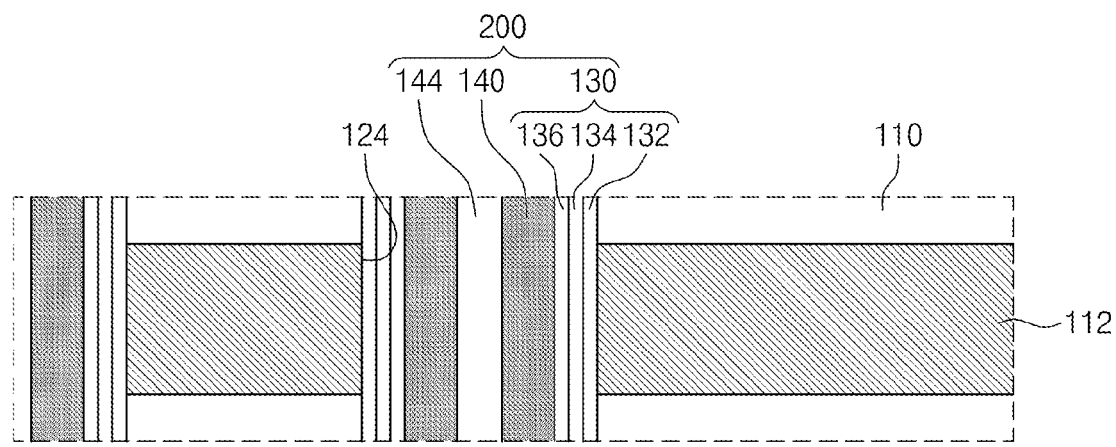

Referring to FIGS. 2A, 10, and 10A, the vertical channel structures 200 may be formed on the substrate 100 to extend toward the third direction. For example, the vertical channel structures 200 may be formed to penetrate the molding structure 10. As an example, the vertical channel structures 200 may be formed in the channel holes 124, respectively. Each of the vertical channel structures 200 may include the data storing pattern 130, the vertical channel pattern 140, and the insulating gap-filling pattern 144. The vertical channel pattern 140 may be disposed between the data storing pattern 130 and the insulating gap-filling pattern 144. In example embodiments, the vertical channel pattern 140 may be shaped like a hollow cylinder with an open top or a macaroni. In other example embodiments, the vertical channel pattern 140 may be shaped like a pipe with open top and bottom ends. In still other example embodiments, the vertical channel pattern 140 may be shaped like a solid circular cylinder filling the channel hole 124, and in this case, the insulating gap-filling pattern 144 may not be provided in the channel holes 124. The vertical channel pattern 140 may include a semiconductor material with polycrystalline or amorphous crystal structure. For example, the vertical channel pattern 140 may be formed of or include silicon (Si), germanium (Ge), or a mixture thereof. In example embodiments, the vertical channel pattern 140 may include a semiconductor material that is not doped with impurities or is doped with impurities that have the same conductivity type as that of the substrate 100.

The data storing pattern 130 may cover the inner walls of the channel holes 124. For example, the data storing pattern 130 may be a spacer-shaped structure covering the inner walls of the channel holes 124 and extending from the top entrance of the channel hole 124 to the top surface of the semiconductor pattern 128. In example embodiments, the data storing pattern 130 may be shaped like a pipe with open top and bottom ends. The data storing pattern 130 may be in contact with the insulating layers 110 and the sacrificial layers 112 of the molding structure 10. The data storing pattern 130 may include a layer, in which data can be stored using a Fowler-Nordheim tunneling effect. Alternatively, the data storing pattern 130 may include a thin-film structure configured in such a way that data stored therein can be changed by one of ways that are different from the Fowler-Nordheim tunneling effect. For example, the data storing pattern 130 may include a memory element or a layered structure exhibiting a phase-changeable or variable resistance property. The data storing pattern 130 may be configured to include a plurality of layers.

In example embodiments, as shown in FIG. 10A, the data storing pattern 130 may include the first blocking insulating layer 132, the charge storing layer 134, and the tunnel insulating layer 136. For example, the first blocking insulating layer 132, the charge storing layer 134, and the tunnel insulating layer 136 may be formed to sequentially cover the inner wall of the channel hole 124. The first blocking insulating layer 132 may include at least one of a silicon oxide layer and/or high-k dielectrics (e.g., aluminum oxide or hafnium oxide). The first blocking insulating layer 132 may be formed in a single-layered structure or a multi-layered structure including a plurality of layers. As an example, the first blocking insulating layer 132 may be a single-layered structure with a silicon oxide layer. As another example, the first blocking insulating layer 132 may be a multi-layered structure including at least one of an aluminum oxide layer and/or a hafnium oxide layer.

The charge storing layer 134 may be a trap insulating layer or an insulating layer with conductive nano dots. The trap insulating layer may include, for example, a silicon nitride layer. The tunnel insulating layer 136 may be, for example, a silicon oxide layer. The first blocking insulating layer 132 and the charge storing layer 134 may be formed using at least one of PE-CVD or ALD techniques. The tunnel insulating layer 136 may be formed using at least one of PE-CVD, ALD, or thermal oxidation techniques.

The vertical channel pattern 140 may be a liner-shaped structure in contact with the tunnel insulating layer 136. For example, in the channel hole 124, the vertical channel pattern 140 may be formed to conformally cover the inner side surface of the tunnel insulating layer 136. The vertical channel pattern 140 may be connected to the semiconductor pattern 128. The vertical channel pattern 140 may include the semiconductor pattern 128. The vertical channel pattern 140 may be formed of or include a semiconductor material such as a poly silicon layer, a single crystalline silicon layer, or an amorphous silicon layer. Alternatively, the vertical channel pattern 140 may be formed of or include one of silicon (Si), germanium (Ge), or a mixture thereof. Alternatively, the vertical channel pattern 140 may include a semiconductor material that is not doped with impurities or is doped with impurities that have the same conductivity type as that of the substrate 100. The vertical channel pattern 140 may be formed by ALD or CVD technique.

The insulating gap-filling pattern 144 may be formed to fill the remaining space of the channel hole 124 provided with the vertical channel pattern 140. The insulating gap-filling pattern 144 may include a silicon oxide layer or a silicon nitride layer. Before the formation of the insulating gap-filling pattern 144, a hydrogen annealing process may be further performed to cure or remove crystal defects in the vertical channel pattern 140.

Figure 11:
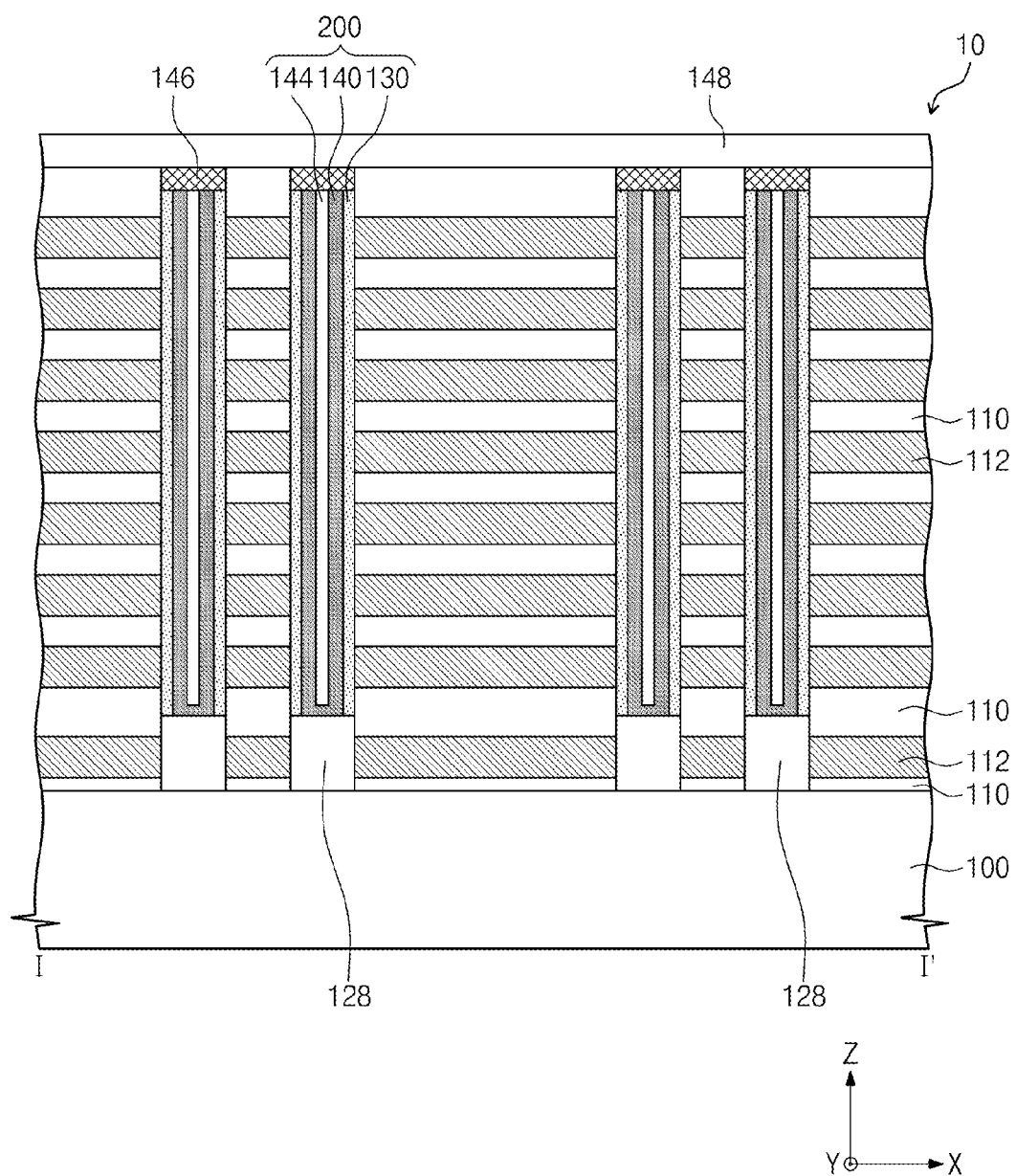

Referring to FIGS. 2A and 11, the conductive pads 146 may be formed on the vertical channel structures 200, respectively. For example, the formation of the conductive pads 146 may include etching the top surfaces of the vertical channel structures 200 to form recessed regions and then filling the recessed regions with a conductive material. Alternatively, the conductive pads 146 may be formed by performing an ion implantation process on the vertical channel patterns 140. The drain regions may be formed in the conductive pads 146 or in the vertical channel patterns 140 under the conductive pads 146. A capping insulating layer 148 may be formed on the conductive pads 146 and the uppermost one of the insulating layers 110.

Figure 12:
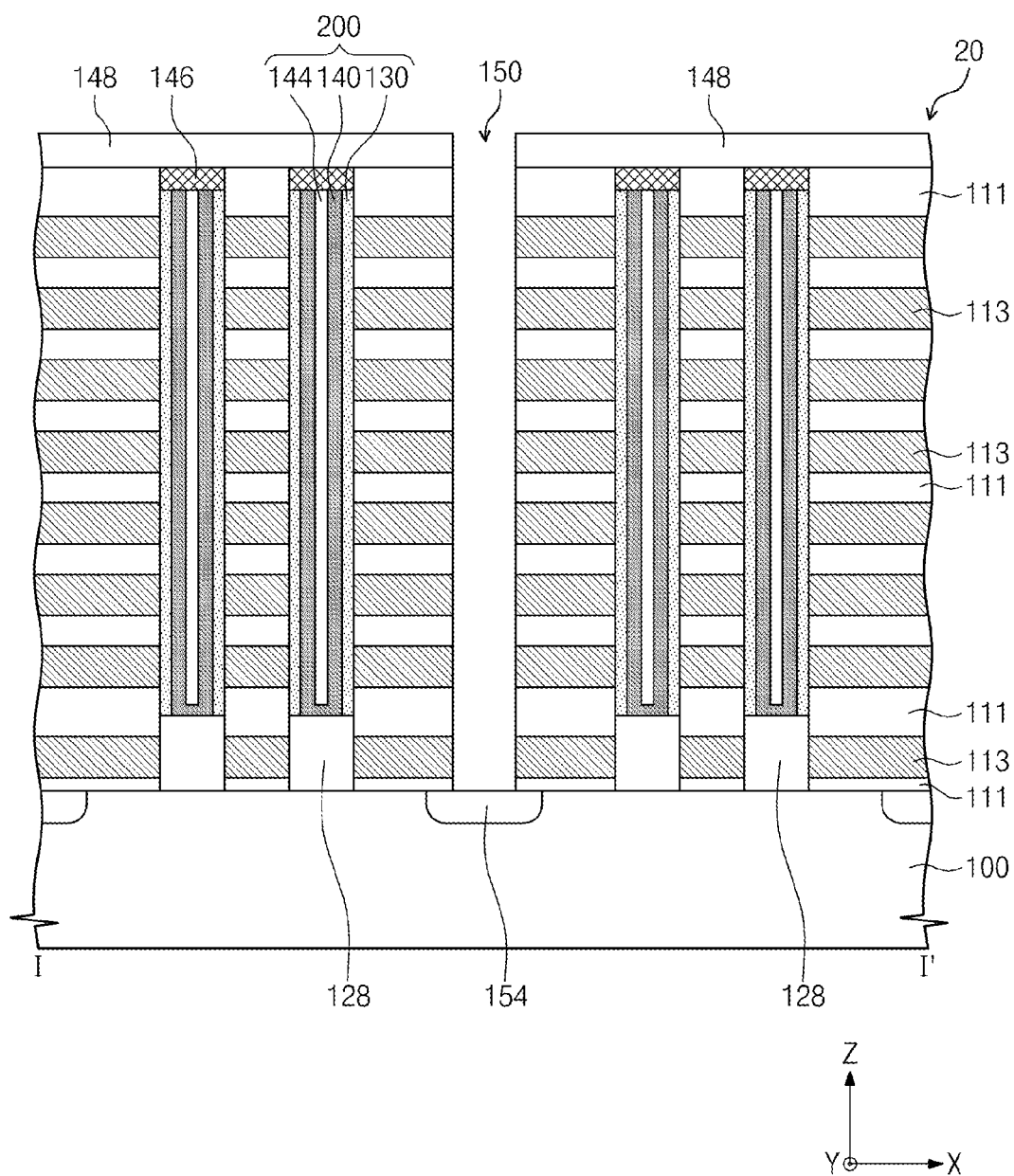

Referring to FIGS. 2A and 12, the molding structure 10 may be patterned to form molding structure patterns 20 including sacrificial patterns 113 and the insulating patterns 111. For example, the formation of the molding structure patterns 20 may include patterning the molding structure 10 to form the trench 150 exposing the substrate 100 between adjacent ones of the vertical channel structures 200. In example embodiments, the formation of the trench 150 may include forming a mask pattern (not shown) on the molding structure 10 to expose a region between the vertical channel structure arrays CSA shown in FIGS. 2A and 2B, and then anisotropically etching the molding structure 10 using the mask pattern as an etch mask. As an example, the molding structure patterns 20 may be formed in such a way that at least two columns of the vertical channel structures 200 are provided in each of them.

The trench 150 may be a line-shaped structure extending parallel to the second direction. Accordingly, the molding structure patterns 20 may be formed spaced apart from each other in the first direction by the trench 150. During the formation of the trench 150, the substrate 100 may be over-etched to have a recessed top surface under the trench 150.

Figure 13:
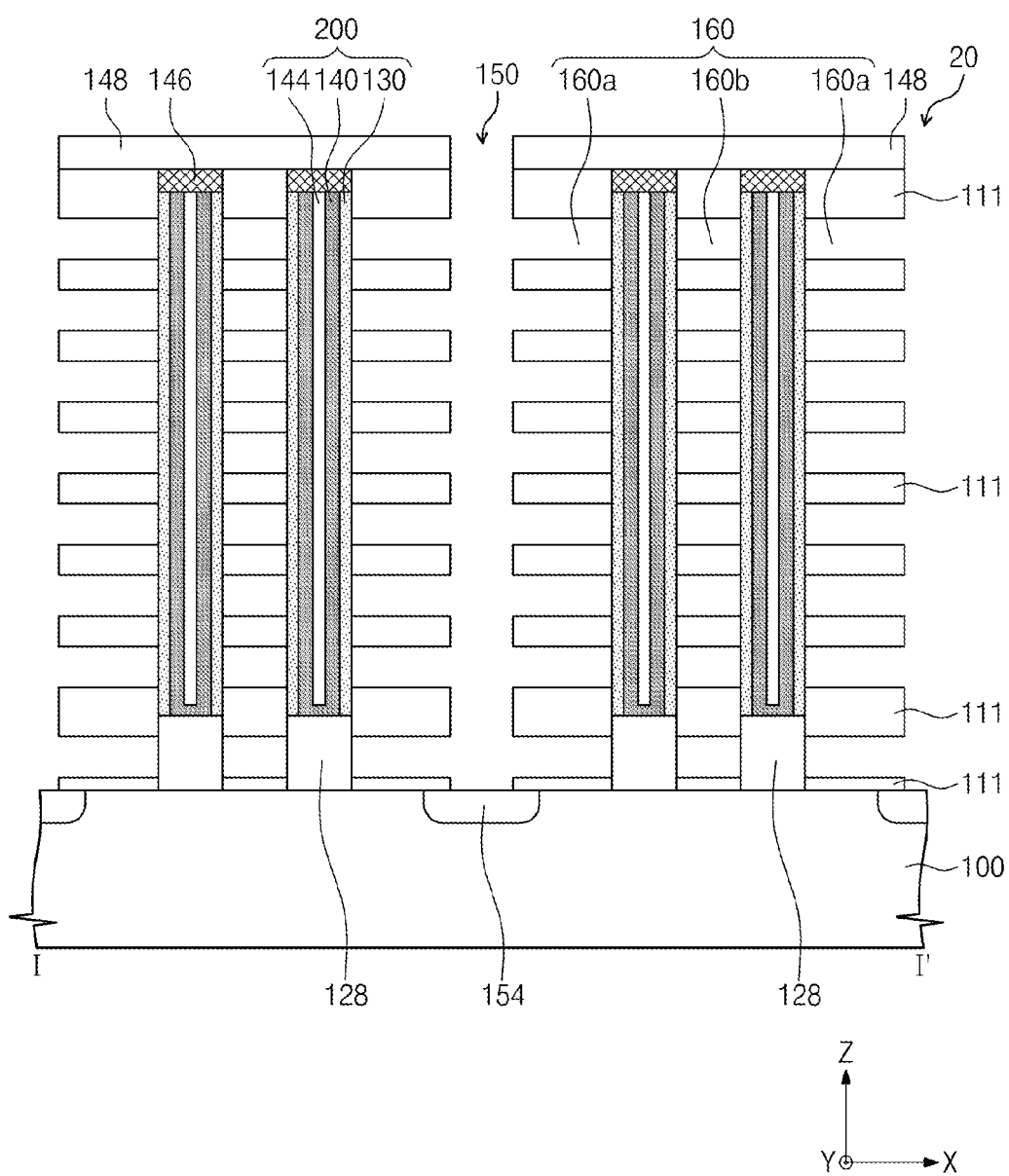

Referring to FIGS. 2A and 13, the opening regions 160 may be formed in the molding structure patterns 20. The sacrificial patterns 113 exposed by the trench 150 may be removed to form the opening regions 160 between the insulating patterns 111. In the case where the sacrificial patterns 113 are formed of a silicon nitride layer and the insulating patterns 111 are formed of a silicon oxide layer, etching solution containing phosphoric acid may be used to isotropically etch the sacrificial layer patterns 113 and form the opening regions 160. Each of the opening regions 160 may define a region where the gate electrode will be formed. In example embodiments, the opening regions 160 may be formed to expose partially the vertical channel structures 200. For example, the data storing pattern 130 of each of the vertical channel structures 200 may be exposed by the opening regions 160. In example embodiments, the first blocking insulating layer 132 (e.g., of FIG. 10A) of the data storing pattern 130 may be exposed by the opening regions 160. Each of the opening regions 160 may include the first opening region 160a located between the trench 150 and the vertical channel structures 200 and the second opening region 160b located between the vertical channel structures 200, and the first and second opening regions 160a and 160b formed at the same level from the main surface of the substrate 100 may be connected to each other through gap regions between the vertical channel structures 200. The first opening region 160a may correspond to an edge region of each of the opening regions 160, and the second opening region 160b may correspond to an internal region of each of the opening regions 160. As an example, the first opening region 160a may be provided between the trench 150 and the vertical channel structures 200 to expose the vertical channel structures 200 in the first direction. The second opening region 160b may be provided between the vertical channel structures 200 to expose the vertical channel structures 200. The first and second opening regions 160a and 160b may extend parallel to the second direction. In example embodiments, the opening regions 160 may be formed to expose the sidewall of the semiconductor pattern 128. An oxidation process may be performed on the sidewall of the semiconductor pattern 128 exposed by the opening regions 160 and the substrate 100 exposed by the trench 150 to form an oxide layer (not shown) thereon.

The common source region 154 may be formed in a portion of the substrate 100 exposed by the trench 150. The common source region 154 may include an impurity region. The common source region 154 may be formed by an ion implantation process. The common source region 154 may be or include an impurity region, which is doped to have, for example, the second conductivity type (e.g., n-type) that is different from that of the substrate 100.

Figure 14:
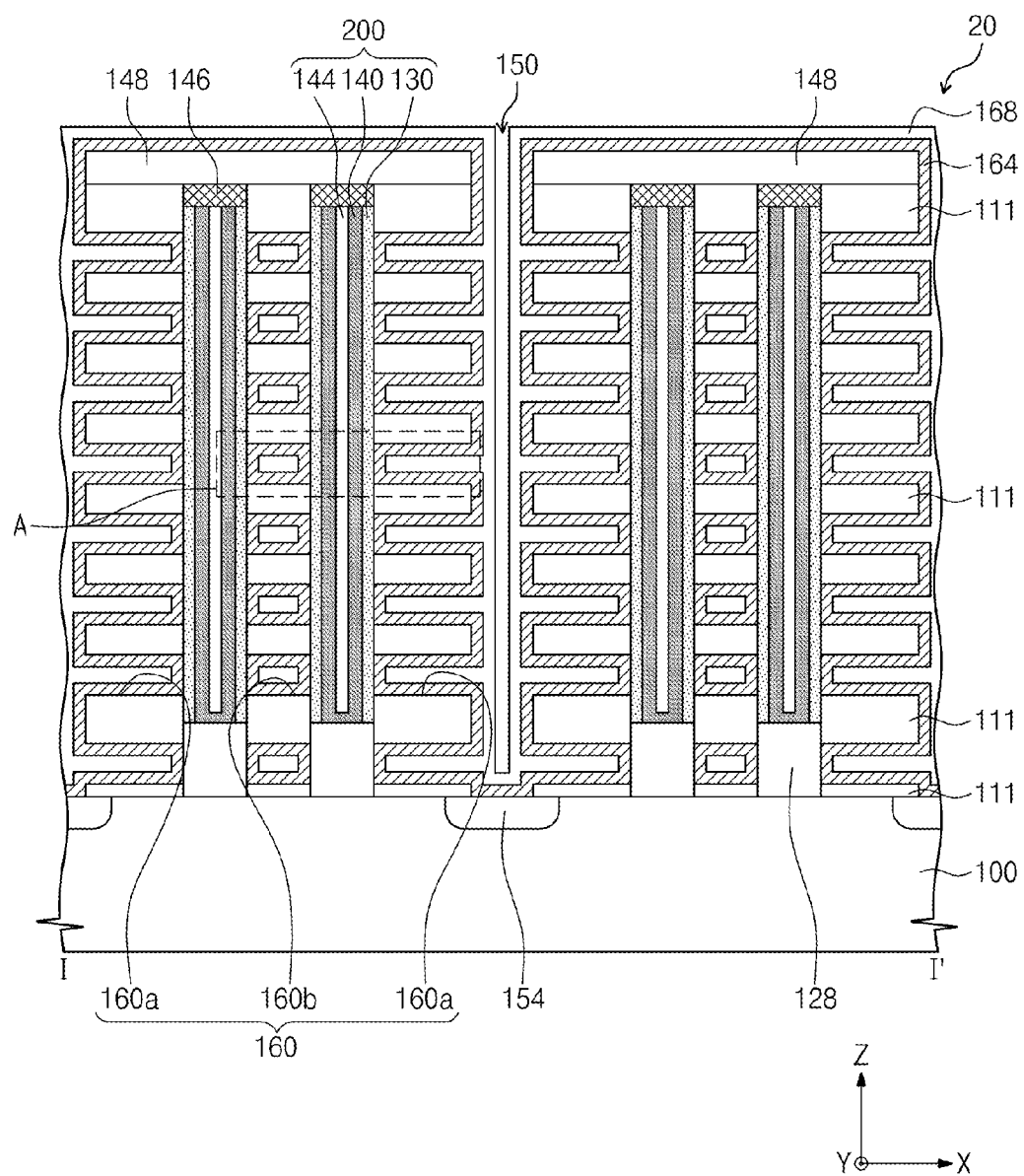
Figure 14A:
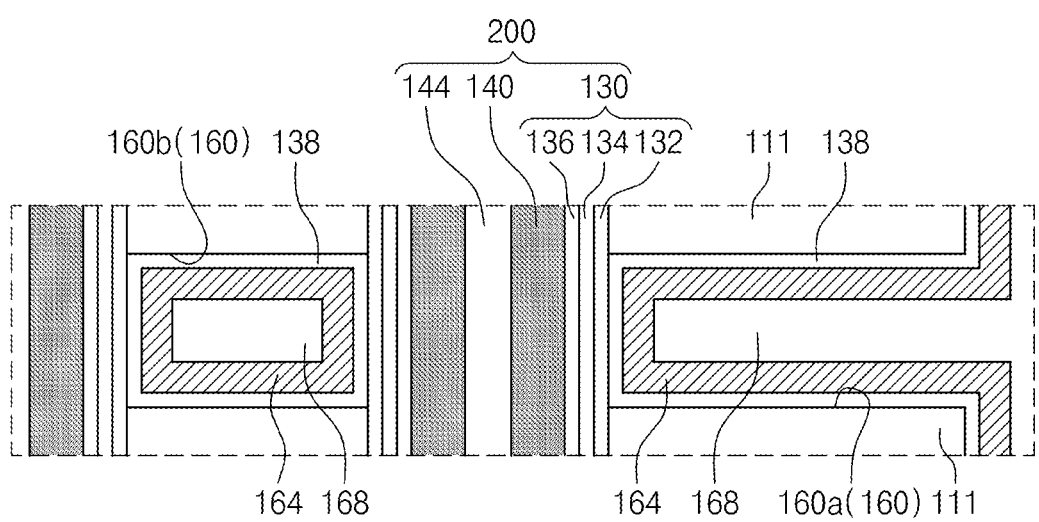

Referring to FIGS. 2A, 14, and 14A, a barrier layer 164 and the silicon layer 168 may be sequentially formed on the substrate 100 to fill the opening regions 160 of the molding structure patterns 20. The barrier layer 164 may be formed to conformally cover the inner wall of each of the opening regions 160. The barrier layer 164 may be formed on the sidewalls of the vertical channel structures 200. For example, the barrier layer 164 may be formed adjacent to the sidewall of the first blocking insulating layers 132 of the vertical channel structures 200. For example, the barrier layer 164 may include a metal nitride layer. As an example, the barrier layer 164 may include at least one of a titanium nitride (TiN) layer or a tantalum nitride (TaN) layer. The barrier layer 164 may be formed to have a thickness ranging from about 30 Å to about 150 Å. In the case where the barrier layer 164 is formed to such a thickness, it is possible to limit and/or prevent elements in a gate conductive layer, which will be formed on the barrier layer 164, from being diffused to the vertical channel structures 200. The silicon layer 168 may be formed to fill an empty space of the opening regions 160 with the barrier layer 164. In example embodiments, the silicon layer 168 may be formed not to fill completely the trench 150. The silicon layer 168 may be, for example, a poly-silicon layer or an amorphous silicon layer. Further, the silicon layer 168 may be a doped or undoped layer. The barrier layer 164 and/or the silicon layer 168 may be formed using an ALD or CVD technique.

Before the formation of the barrier layer 164, as shown in FIG. 14A, the second blocking insulating layer 138 may be formed on the substrate 100 to conformally the inner wall of the cover each of the opening regions 160. For example, the second blocking insulating layer 138 may be formed to be in contact with horizontal surfaces of the insulating patterns 111 and the sidewall of the vertical channel structures 200. As an example, the second blocking insulating layer 138 may be in contact with the first blocking insulating layer 132. In this case, the second blocking insulating layer 138 may be disposed between the first blocking insulating layer 132 and the barrier layer 164. In addition, the second blocking insulating layer 138 may be formed on the sidewall of the semiconductor pattern 128 and the top surface of the common source region 154. In this case, the second blocking insulating layer 138 may be disposed between the semiconductor pattern 128 and the barrier layer 164. In example embodiments, the formation of the second blocking insulating layer 138 may be omitted.

Figure 15:
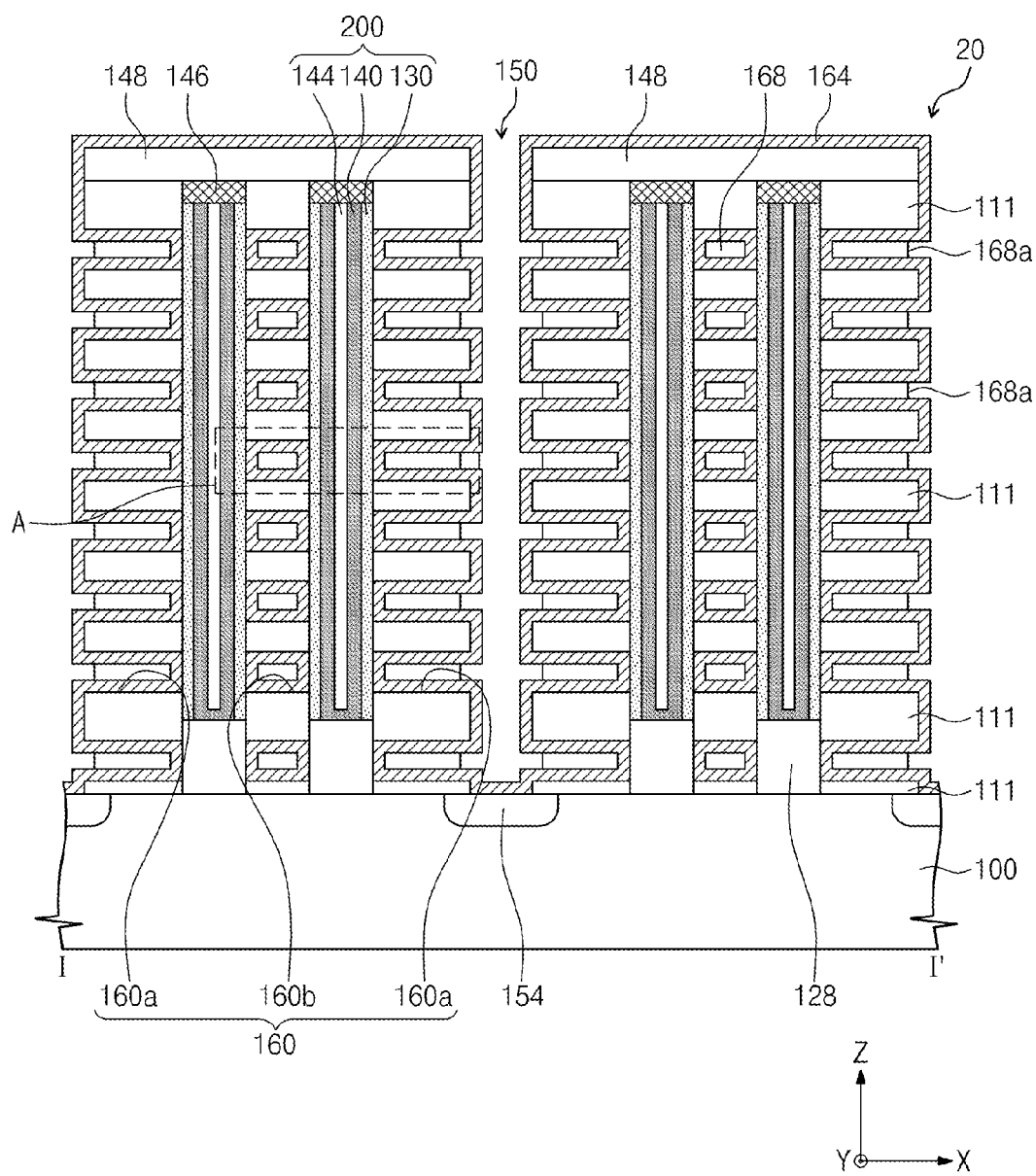
Figure 15A:
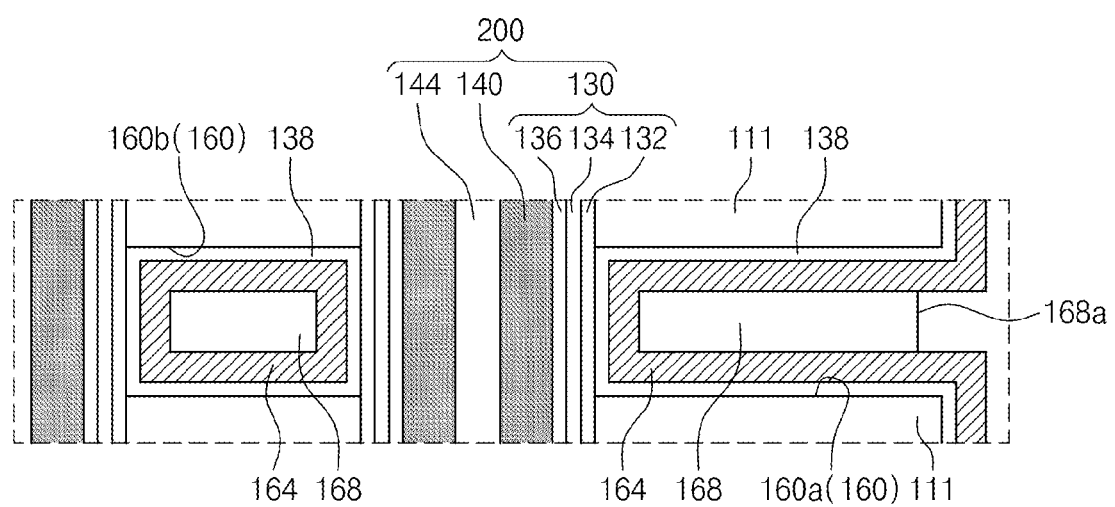

Referring to FIGS. 2A, 15, and 15A, the silicon layer 168 may be patterned. For example, the patterning of the silicon layer 168 may include etching a portion of the silicon layer 168 to form a truncated end portion 168a. As an example, the silicon layer 168 may be recessed into the opening regions 160 by a wet etching process. As the result of the patterning of the silicon layer 168, the barrier layer 164 may be partially exposed at a region adjacent to the sidewall of the molding structure pattern 20.

Figure 16:
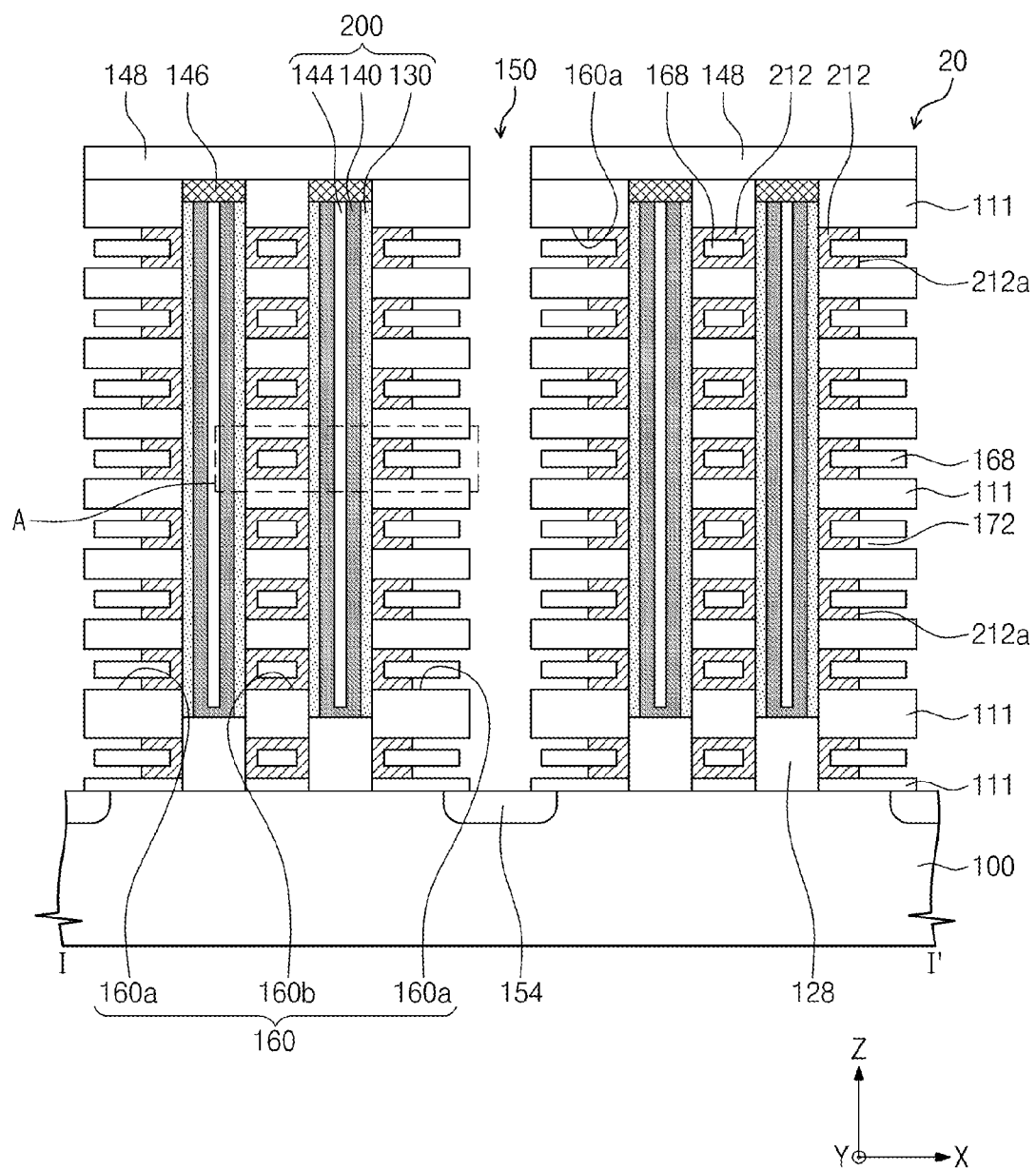
Figure 16A:
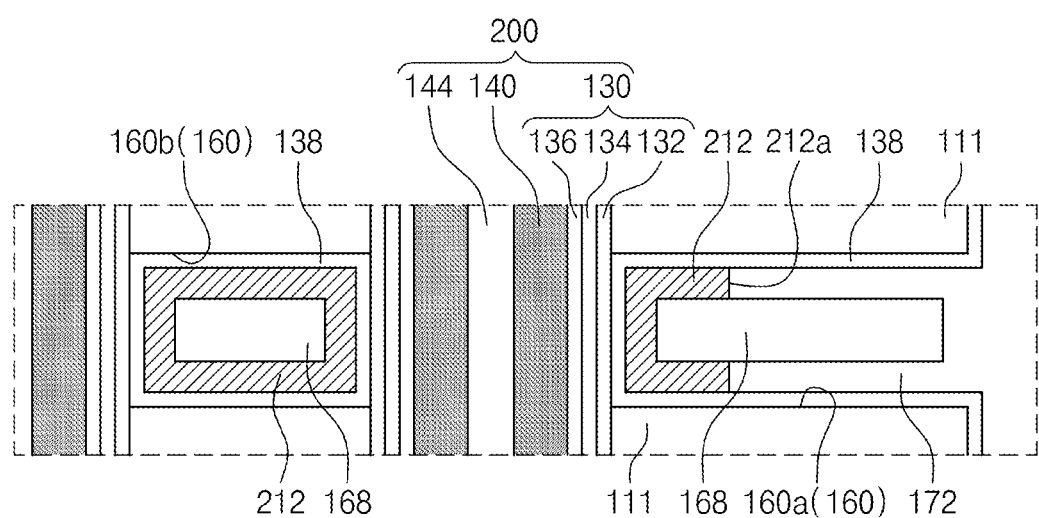

Referring to FIGS. 2A, 16, and 16A, the barrier layer 164 may be patterned to form the first gate conductive layer 212. The first gate conductive layer 212 may be formed by selectively etching a portion of the barrier layer 164 exposed by the patterned silicon layer 168, and thus, the first gate conductive layer 212 can have the truncated end portion 212a. In the first opening region 160a, the first gate conductive layer 212 may be formed adjacent to the vertical channel structures 200, compared with the trench 150. In example embodiments, the first gate conductive layer 212 may be formed by horizontally recessing the barrier layer 164 in the first opening region 160a using an isotropic etching process. Accordingly, the groove 172 may be formed in the first opening region 160a and between the patterned silicon layer 168 and the insulating patterns 111. In example embodiments, the groove 172 may be formed between the patterned silicon layer 168 and the second blocking insulating layer 138.

Figure 17:
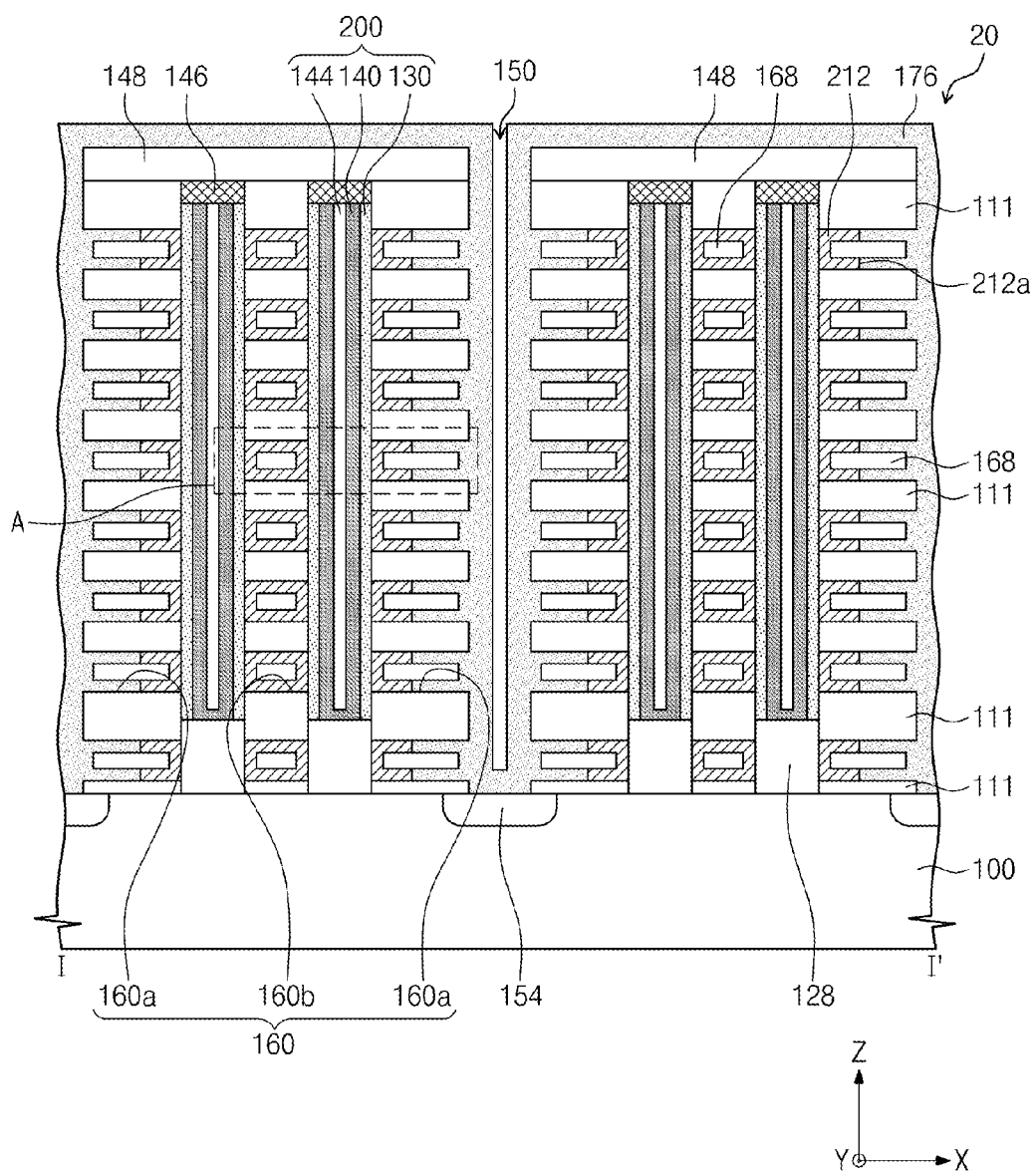
Figure 17A:
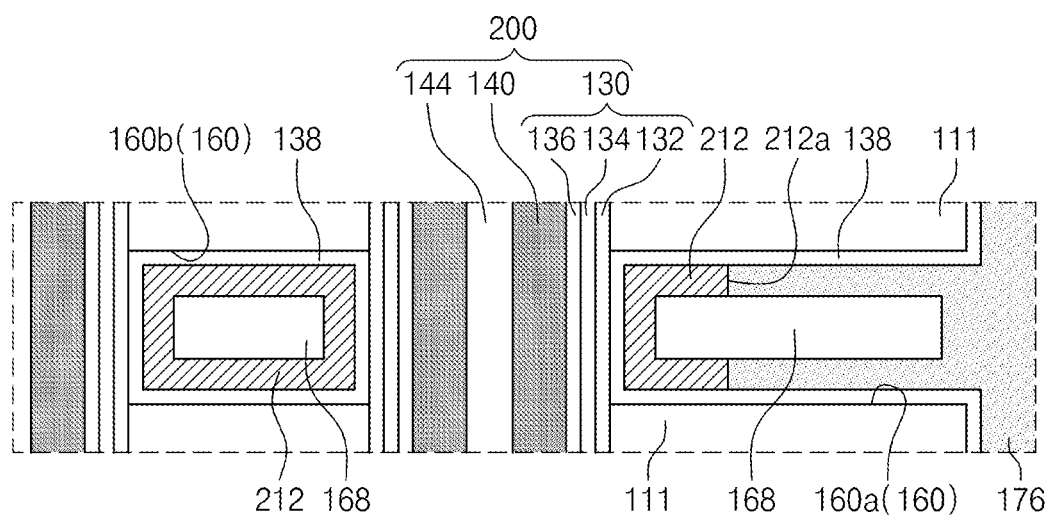

Referring to FIGS. 2A, 17, and 17A, a metal layer 176 may be formed on the substrate 100 to fill the groove 172 in the first opening region 160a. In example embodiments, the metal layer 176 may be formed of or include a nickel layer. Alternatively, the metal layer 176 may be formed of or include at least one of cobalt, platinum, titanium, tantalum, or tungsten. The metal layer 176 may be formed by ALD or CVD technique. In example embodiments, the patterned silicon layer 168 may be removed from the opening regions 160, and then, the metal layer 176 may be formed to fill the opening regions 160.

In other embodiment, as shown in FIG. 21, before the formation of the metal layer 176, a dummy silicon layer 170 may be additionally formed to fill the groove 172 between the patterned silicon layer 168 and the second blocking insulating layer 138. Next, a wet etching process may be performed to remove a portion of the dummy silicon layer 170, and in this case, the dummy silicon layer 170 may have an end portion 170a positioned in the first opening region 160a. Thereafter, the metal layer 176 may be formed to fill the first opening region 160a. The dummy silicon layer 170 may be formed of or include, for example, a poly-silicon layer or an amorphous silicon layer. The dummy silicon layer 170 may be doped or undoped layer. The dummy silicon layer 170 may be formed by ALD or CVD technique.

Figure 18:
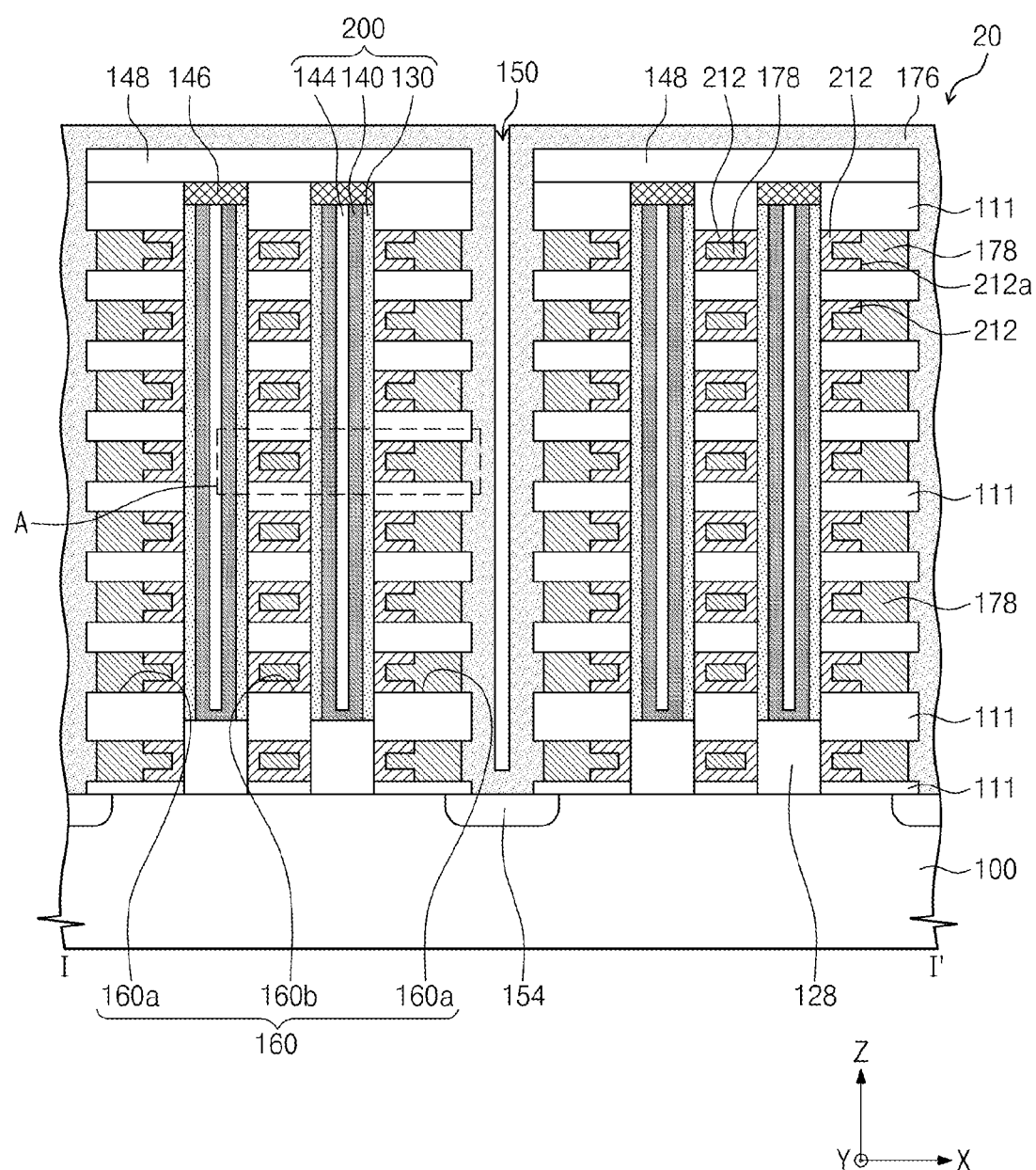
Figure 18A:
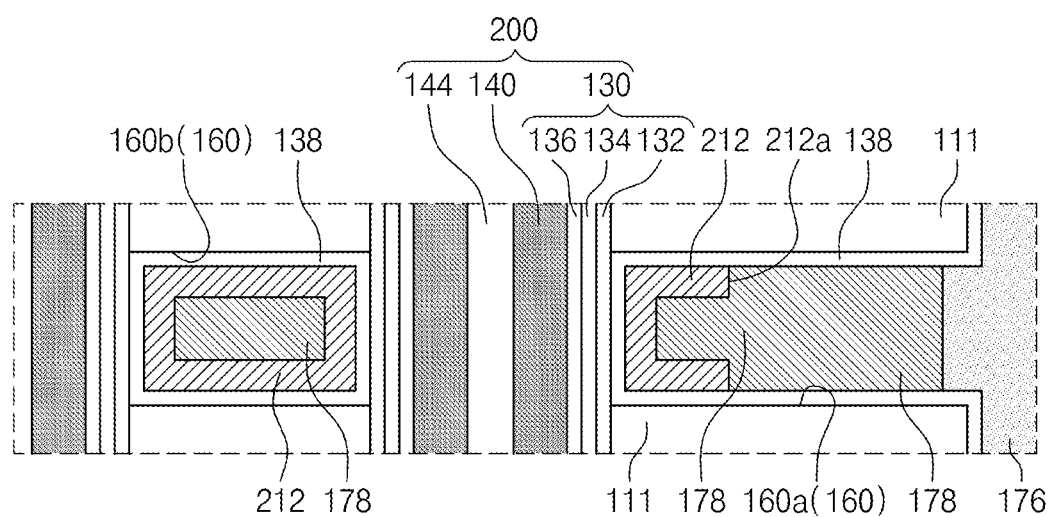

Referring to FIGS. 2A, 18, and 18A, the metal silicide layer 178 may be formed in the opening regions 160. The formation of the metal silicide layer 178 may include thermally treating the metal layer 176 and the patterned silicon layer 168 at a temperature of 250-600° C. In the case of the embodiments described with reference to FIG. 21, the formation of the metal silicide layer 178 may include thermally treating the metal layer 176, the patterned silicon layer 168, and the dummy silicon layer 170 at a temperature of 250-600° C.

Figure 19:
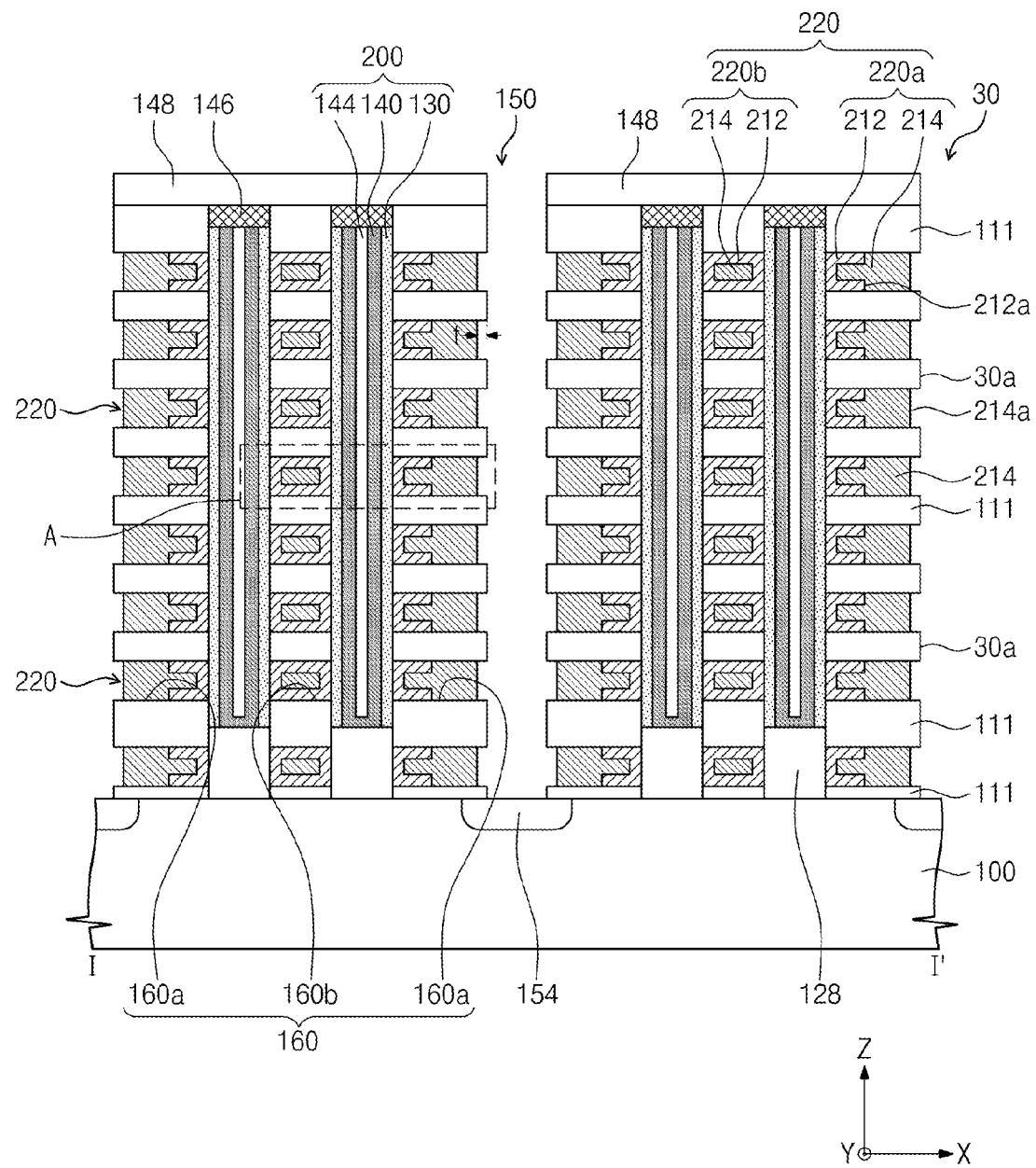
Figure 19A:
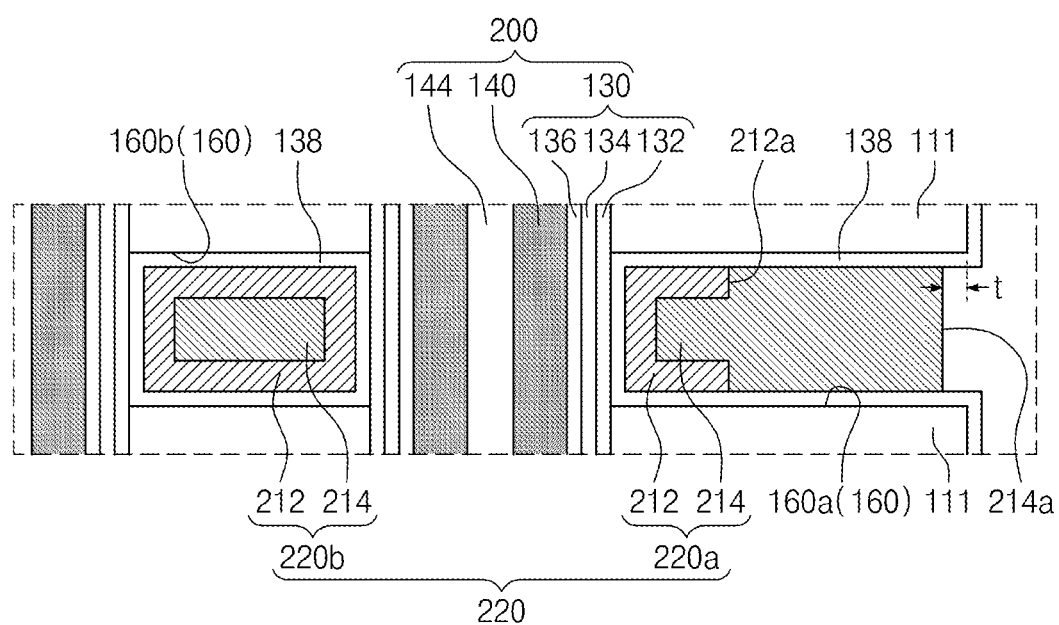

Referring to FIGS. 2A, 19, and 19A, the stacks 30 may be formed on the substrate 100. Each of the stacks 30 may include the insulating patterns 111 and the gate electrodes 220 that are alternately stacked on each other. Each of the gate electrodes 220 may include the first gate conductive layer 212 and the second gate conductive layer 214. After the thermal treatment, an unreacted portion of the metal layer 176 may be removed to remain the metal silicide layer 178, which is used as the second gate conductive layer 214, in each of the opening regions 160. Thus, the second gate conductive layer 214 may have the truncated end portion 214a in the first opening region 160a. The first gate conductive layer 212 and the second gate conductive layer 214 may be formed in each of the opening regions 160. The first region 220a of the gate electrodes 220 may be provided in the first opening region 160a, and the second region 220b of the gate electrodes 220 may be provided in the second opening region 160b.

The first gate conductive layer 212 of each of the gate electrodes 220 may have the truncated end portion 212a and a ring-shaped portion, which are provided in the first and second regions 220a and 220b, respectively, and are continuously connected to each other. For example, the first gate conductive layer 212 may have a cross section shaped like a letter "C" or a sideways letter "U" in the first region 220a and have a cross section shaped like a ring in the second region 220b. The second gate conductive layer 214 may have the truncated end portion 214a in the first region 220a and extend into the second region 220b.

In the first region 220a of each of the gate electrodes 220, the first gate conductive layer 212 may be formed adjacent to the vertical channel structures 200, and the second gate conductive layer 214 may include a portion, which is positioned adjacent to the vertical channel structures 200 and is covered with the first gate conductive layer 212, and an opposite portion, which is positioned adjacent to the sidewall 30a of the stack 30 and is not covered with the first gate conductive layer 212. For example, the opposite portion of the second gate conductive layer 214 may be in contact with the second blocking insulating layer 138 or the insulating patterns 111 and extend toward the sidewall 30a of the stack 30. Accordingly, the opposite portion of the second gate conductive layer 214 may be thicker than the portion adjacent to the vertical channel structures 200, and this makes it possible to reduce electric resistance of the gate electrodes 220. Since the gate electrodes 220 can have a reduced resistance without an increase in thickness of the gate electrodes 220, it is possible to improve not only an integration density of the vertical-type semiconductor memory device but also electric characteristics thereof. The truncated end portion 214a of the second gate conductive layer 214 may be recessed by a depth t in the first direction or in a direction from the sidewall 30a of the stack 30 (e.g., the side surface of the insulating pattern 111) toward the vertical channel structures 200. As a result, it is possible to achieve vertical separation between the gate electrodes 220 adjacent to each other in the third direction and thereby to limit and/or prevent electric short circuit from being formed therebetween.

In the second region 220b of each of the gate electrodes 220, the first gate conductive layer 212 may be provided to cover the top, bottom, and side surfaces of the second gate conductive layer 214. For example, the first gate conductive layer 212 may be formed to conformally cover inner surfaces of the second opening region 160b and thereby to have a ring-shaped section. A part of the second gate conductive layer 214 may be thicker in the first region 220a than in the second region 220b.

In the case where, during the silicidation process, the silicide layer 178 for the second gate conductive layer 214 is formed to be too thin to fill the groove 172 between the second gate conductive layer 214 and the insulating patterns 111, the air gap 190 may be formed, as shown in FIG. 4. In other words, the air gap 190 may be formed between the second blocking insulating layer 138 and the second gate conductive layer 214. Alternatively, in the case where the silicide layer 178 for the second gate conductive layer 214 is incompletely silicidated during the silicidation process, the silicon layer 168 may remain in the second opening region 160b and may serve as the second region 220b of the gate electrode 220, as shown in FIG. 5. Alternatively, the silicidation process may be performed in such a way that the silicide layer 178 for the second gate conductive layer 214 is not formed in the second opening region 160b, as shown in FIG. 6, and in this case, the second region 220b of the gate electrode 220 may not include the second gate conductive layer 214. For example, the whole region of the second opening region 160b may be filled with first gate conductive layer 212, without the silicide layer 178. Alternatively, the second gate conductive layer 214 may be formed of the metal layer (e.g., 176 of FIG. 18), without any silicide layer (e.g., 178 of FIG. 18). Referring to FIGS. 2A, 20, and 20A, the insulating separation layer 180 and the source via plug 182 may be formed between the stacks 30 or in the trench 150. The insulating separation layer 180 may be formed in the trench 150 to cover the sidewall 30a of the stacks 30. In example embodiments, the insulating separation layer 180 may be formed to have a spacer structure exposing the common source region 154 and being in contact with the gate electrodes 220. The insulating separation layer 180 may be formed to fill gap regions between the insulating patterns 111 that are disposed vertically adjacent to each other, and this makes it possible to protect the outer side surfaces of the gate electrodes 220.

The source via plug 182 may be formed on the common source region 154. The source via plug 182 may be connected to the common source region 154, and thus, electric resistance of the common source region 154 can be effectively reduced. The source via plug 182 may be a line-shaped pattern extending parallel to the second direction. Alternatively, the source via plug 182 may include a plurality of island-shaped patterns arranged along the second direction. The source via plug 182 may include a conductive material. For example, the conductive material for the source via plug 182 may include at least one of metallic materials (e.g., tungsten). In example embodiments, before the formation of the source via plug 182, a silicide layer may be formed on or in the common source region 154. Alternatively, the silicide layer may be formed during the formation of the source via plug 180.

In example embodiment, as shown in FIG. 5, in the second region 220b, the second gate conductive layer 214 may be formed to include the silicon layer 168 and the metal silicide layer 178. Alternatively, in the second region 220b, the second gate conductive layer 214 may be formed to include only the silicon layer 168. For example, as shown in FIG. 6, the substantially whole region of the second opening region 160b may be filled with the first gate conductive layer 212 without the second gate conductive layer 214.

Figure 22:
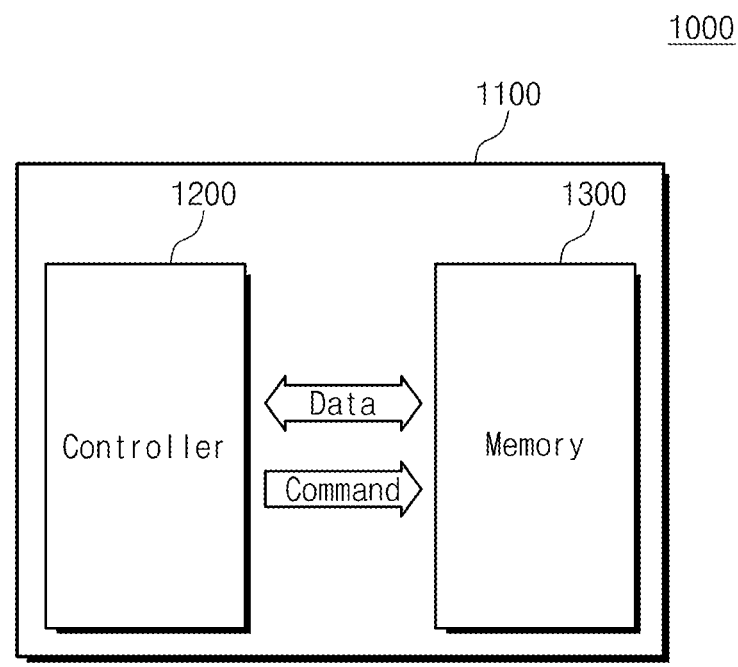
FIG. 22 is a schematic block diagram illustrating an example of semiconductor device systems including a semiconductor memory device according to example embodiments of inventive concepts.

FIG. 22 is a schematic block diagram illustrating an example of semiconductor memory systems including a semiconductor memory device according to example embodiments of inventive concepts. Referring to FIG. 22, a memory system 1000 may be configured to store data in at least one semiconductor device. For example, the memory system 1000 may be provided in the form of a memory card or a solid state drive (SSD). The memory system 1000 may include a controller 1200 and a memory device 1300 provided in a housing 1100. The memory system 1000 may be configured to allow electric signals to be exchanged between the controller 1200 and the memory device 1300. For example, an operation of exchanging data between the memory device 1300 and the controller 1200 may be executed in response to commands from the controller 1200. In other words, the memory system 1000 may be configured to store data in the memory device 1300 or send data stored in the memory device 1300 to the outside thereof. The memory device 1300 may include one of the semiconductor memory devices according to example embodiments of inventive concepts.

Figure 23:
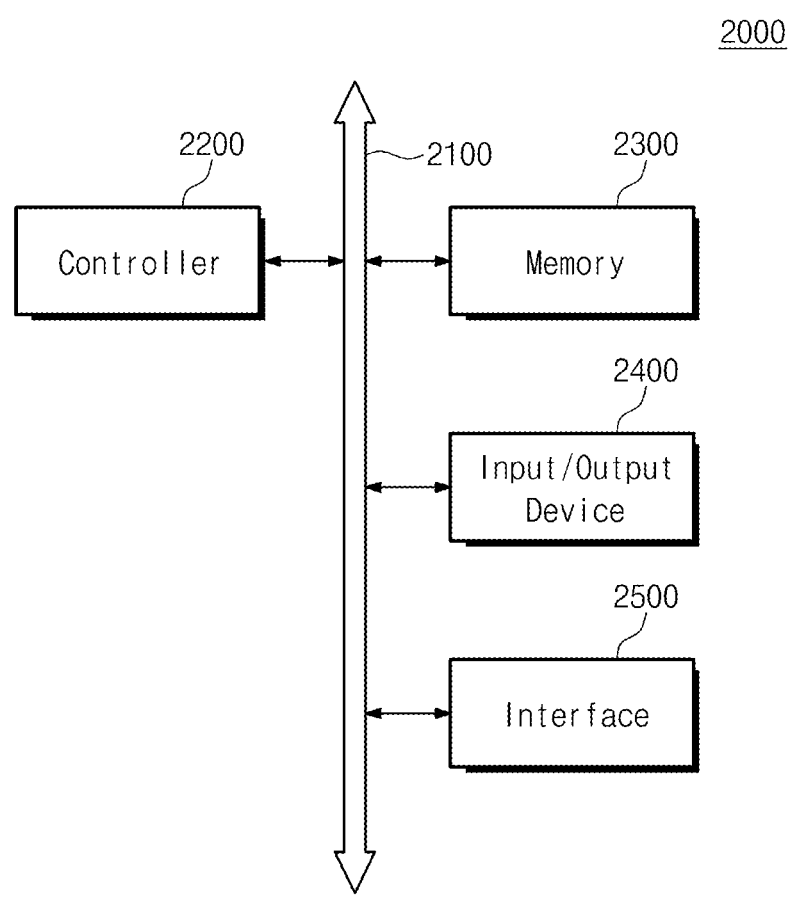
FIG. 23 is a schematic block diagram illustrating an example of electronic systems including a semiconductor memory device according to example embodiments of inventive concepts.

FIG. 23 is a schematic block diagram illustrating an example of electronic systems including a semiconductor memory device according to example embodiments of inventive concepts.

Referring to FIG. 23, an electronic system 2000 may include a controller 2200, a memory device 2300, and an input-output unit 2400. The controller 2200, the memory device 2300, and the input-output unit 2400 may be electrically coupled or connected to each other via a bus 2100. The bus 2100 may correspond to a path through which electrical signals or data are transmitted. The controller 2200 may include at least one of a microprocessor, a digital signal processor, a microcontroller, or a logic device. The logic device may have a similar function to any one of the microprocessor, the digital signal processor and the microcontroller. The input-output unit 2400 may include at least one of a keypad, a keyboard, or a display device. The memory device 2300 may store data and/or commands executed by the controller 2200. The memory device 2300 may include a volatile memory device and/or a nonvolatile memory device. For example, the memory device 2300 may include a FLASH memory device. Alternatively, the memory device 2300 may include a solid state drive (SSD) including at least one FLASH memory device, and in this case, the electronic system 2000 may stably store a large capacity of data. In example embodiments, the memory device 2300 may include the semiconductor memory device according to example embodiments of inventive concepts. The electronic system 2000 may further include an interface unit 2500 for transmitting or receiving data to or from a communication network through a wireless or wired way. For example, the interface unit 2500 may include an antenna for wireless communication or a transceiver for wired communication.

The semiconductor memory devices disclosed above may be encapsulated using various and diverse packaging techniques. For example, semiconductor memory devices according to the aforementioned embodiments may be encapsulated using any one of a package on package (POP) technique, a ball grid array (BGA) technique, a chip scale package (CSP) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the semiconductor memory device according to one of the above embodiments is mounted may further include at least one semiconductor device (e.g., a controller and/or a logic device) that controls the semiconductor memory device.

According to example embodiments of inventive concepts, it is possible to enhance a barrier property of the first gate conductive layer that is disposed adjacent to the vertical channel structures. Further, the second gate conductive layer can be formed to have a uniform thickness, and this makes it possible to reduce electric resistance of the gate electrodes. Accordingly, it is possible to realize a vertical-type semiconductor memory device with improved electric characteristics, improved reliability, and increased integration density.

While example embodiments of inventive concepts have been particularly shown and described, it will be understood by one of ordinary skill in the art that variations in form and detail may be made therein without departing from the spirit and scope of the claims.

What is claimed is:

1. A semiconductor memory device, comprising:
a substrate;
a stack on the substrate, the stack including insulating patterns and gate electrodes alternately and repeatedly stacked on each other; and
vertical channel structures penetrating the insulating patterns and the gate electrodes,
each of the gate electrodes including first and second gate conductive layers,
each of the gate electrodes including a first region between an outer side of the stack and the vertical channel structures and a second region between the vertical channel structures,
the first gate conductive layer in the first region being adjacent to the vertical channel structures and including a truncated end portion,
the second gate conductive layer in the first region having a portion that is adjacent to the vertical channel structures and is covered by the first gate conductive layer,
the second gate conductive layer in the first region having an opposite portion, that is adjacent to the outer side of the stack and is not covered by the first gate conductive layer, the first gate conductive layer in the second region being extended to continuously cover top, bottom, and side surfaces of the second gate conductive layer in the second region.

2. The device of claim 1, wherein an air gap is defined between the second gate conductive layer in the first region and the insulating patterns.

3. The device of claim 1, wherein the first gate conductive layer includes a metal nitride layer and a thickness of the metal nitride layer ranges from 30 Å to 150 Å.

4. The device of claim 1, wherein each of the vertical channel structures includes a blocking insulating layer, a charge storing layer, a tunnel insulating layer, and a semiconductor material.

5. The device of claim 1, wherein the second gate conductive layer includes one of a metal silicide layer and a metal layer.

6. The device of claim 1, wherein the second gate conductive layer includes a nickel silicide layer.

7. The device of claim 1, wherein each gate electrode in the second region further comprises a third conductive layer being in contact with the second conductive layer.

8. A semiconductor memory device, comprising:
a substrate;
vertical channel patterns on the substrate, each of the vertical channel patterns including a semiconductor material; and
a stack enclosing the vertical channel patterns on the substrate, the stack including a first region between an outside of the stack and the vertical channel patterns, a second region between the vertical channel patterns, and gate electrodes stacked on top of each other,
each of the gate electrodes including a barrier layer and a metal silicide layer,
each of the barrier layers in the first region being adjacent to the vertical channel patterns and including a truncated end portion,
each of the metal silicide layers in the first region having a portion that is adjacent to the vertical channel patterns and is covered by a corresponding one of the barrier layers,
each of the metal silicide layers in the first region having an opposite portion that is adjacent to the outer side of the stack and is not covered by the corresponding one of the barrier layers, and
each of the barrier layers in the second region being extended to continuously cover top, bottom, and side surfaces of a corresponding one of the metal silicide layers in the second region.

9. The device of claim 8, wherein the barrier layer includes a metal nitride layer, and the metal silicide layer includes a nickel silicide layer.

10. The device of claim 8, wherein the metal silicide layer is thicker in the first region than in the second region.

11. The device of claim 8, wherein, a thickness of the barrier layer ranges from 30 Å to 150 Å.

12. The device of claim 8, wherein each gate electrode in the second region further comprises a silicon layer being in contact with the metal silicide layer.

13. The device of claim 8, further comprising a blocking insulating layer, a charge storing layer, and a tunnel insulating layer adjacent to each of the vertical channel patterns.

14. A semiconductor memory device, comprising:
a substrate including a common source region;
a plurality of stacks spaced apart from each other on the substrate, each stack including gate electrodes and insulating layers alternately stacked on each other, a spacing between the plurality of stacks defining a trench that exposes the common source region; and,
a plurality of vertical channel structures penetrating each of the stacks, the vertical channel structures separated from each other and arranged in columns,
each gate electrode having a different cross-sectional shape in a first region compared to a second region, the first region being between the trench and the vertical channel structures of a corresponding one of the columns that is adjacent to the trench, the second region being between the vertical channel structures, each gate electrode including first and second gate conductive layers,
the first gate conductive layer extending between the vertical channel structures in the second region, the first gate conductive layer in the first region defining a cavity facing the trench based on the first gate conductive layer having a width at a middle portion that is less than a width at lower and upper portions of the first gate conductive layer in the first region, and the second gate conductive layer in the first region including a first portion in the cavity and a second portion between the trench and the first gate conductive layer.

15. The semiconductor memory device of claim 14, wherein the first gate conductive layer in the second region surrounds top, bottom, and side surfaces of the second gate conductive layer in the second region.

16. The semiconductor memory device of claim 14, wherein
the first gate conductive layer includes a metal nitride layer, and the second gate conductive layer includes a metal silicide layer.

17. The semiconductor memory device of claim 14, wherein
a thickness of the first portion of the second gate conductive layer is less than a thickness of the second portion of the second gate conductive layer.

18. The semiconductor memory device of claim 14, wherein each vertical channel structure further comprises a vertical channel pattern, and a data storing pattern between the vertical channel pattern and the gate electrodes.

19. The device of claim 14, wherein, the width at a middle portion of the first gate conductive layer ranges from 30 Å to 150 Å.

* * * * *